United States Patent
Rinaldi et al.

(10) Patent No.: US 10,673,407 B2
(45) Date of Patent: Jun. 2, 2020

(54) MICROELECTROMECHANICAL RESONANT CIRCULATOR

(71) Applicants: Northeastern University, Boston, MA (US); Board of Regents, The University of Texas System, Austin, TX (US)

(72) Inventors: Matteo Rinaldi, Boston, MA (US); Cristian Cassella, East Boston, MA (US); Andrea Alu, Austin, TX (US); Dimitrios Sounas, Austin, TX (US); Ahmed Kord, Austin, TX (US)

(73) Assignees: Northeastern University, Boston, MA (US); Board of Regents, The University of Texas System, Austin, TX (US)

( * ) Notice: Subject to any disclaimer, the term of this patent is extended or adjusted under 35 U.S.C. 154(b) by 199 days.

(21) Appl. No.: 15/812,296

(22) Filed: Nov. 14, 2017

(65) Prior Publication Data

US 2018/0138889 A1 May 17, 2018

Related U.S. Application Data

(60) Provisional application No. 62/421,477, filed on Nov. 14, 2016.

(51) Int. Cl.
*H03H 9/24* (2006.01)
*H01P 1/38* (2006.01)
(Continued)

(52) U.S. Cl.
CPC ............. *H03H 9/2405* (2013.01); *H01P 1/20* (2013.01); *H01P 1/36* (2013.01); *H01P 1/38* (2013.01); *H01P 1/397* (2013.01); *H03H 7/52* (2013.01); *H03H 9/02275* (2013.01); *H03H 9/171* (2013.01); *H03H 9/586* (2013.01); *H03H 19/004* (2013.01); *H03H 2007/006* (2013.01)

(58) Field of Classification Search
CPC ............. H03H 9/2405; H03H 9/02275; H03H 19/004; H03H 9/171; H03H 7/52; H03H 9/586; H03H 2007/006; H01P 1/36; H01P 1/397; H01P 1/20; H01P 1/38
USPC .................. 333/1.1, 133, 186, 187, 193–196
See application file for complete search history.

(56) References Cited

U.S. PATENT DOCUMENTS 7,843,283 B2 * 11/2010 Reichenbach ........... H01Q 3/26
 333/186
9,419,583 B2 8/2016 Rinaldi et al.
(Continued)

OTHER PUBLICATIONS

Reiskarimian, N. et al., "Magnetic-free non-reciprocity based on staggered commutation," Nature Communications 2016; vol. 7, No. 4, 10 pgs DOI: 10.1038/NCOMMS11217.
(Continued)

*Primary Examiner* — Robert J Pascal
*Assistant Examiner* — Jorge L Salazar, Jr.
(74) *Attorney, Agent, or Firm* — Verrill Dana, LLP

(57) ABSTRACT

A microelectromechanical resonant circulator device is providing, having a substrate, and at least three electrical ports supported on the substrate. At least three electromechanical resonator elements are connected with associated switch elements and an associated port. The switch elements are operative to provide commutation over time of the electromechanical resonator elements.

29 Claims, 24 Drawing Sheets

(51) Int. Cl.
*H01P 1/397* (2006.01)
*H03H 9/58* (2006.01)
*H01P 1/36* (2006.01)
*H03H 7/52* (2006.01)
*H01P 1/20* (2006.01)
*H03H 9/02* (2006.01)
*H03H 19/00* (2006.01)
*H03H 9/17* (2006.01)
*H03H 7/00* (2006.01)

(56) References Cited

U.S. PATENT DOCUMENTS

| | | | |
|---|---|---|---|
| 9,425,765 B2 | 8/2016 | Rinaldi et al. | |
| 2007/0096842 A1* | 5/2007 | Hyun | H03H 7/52 |
| | | | 333/1.1 |
| 2009/0237173 A1* | 9/2009 | Ziaei | H01P 1/127 |
| | | | 333/1.1 |

OTHER PUBLICATIONS

Estep, N. et al., "Magnetic-free non-reciprocity and isolation based on parametrically modulated coupled-resonator loops," Nature Physics, Dec. 2014; vol. 10, pp. 923-927.
Qin, S. et al., "Nonreciprocal Components With Distributedly Modulated Capacitors," IEEE Transactions on Microwave Theory and Techniques, Oct. 2014; vol. 22, No. 10, pp. 2260-2272 DOI: 10.1109/TMTT.2014.2347935.
Cassella, Y. et al., "Aluminu Nitride Cross-Sectional Lame Mode Reonators," Journal of Microelectromechanical Systems, Apr. 2016; vol. 25, No. 2, pp. 275-285 DOI:10.1109/JMEMS.2015.2512379.

* cited by examiner

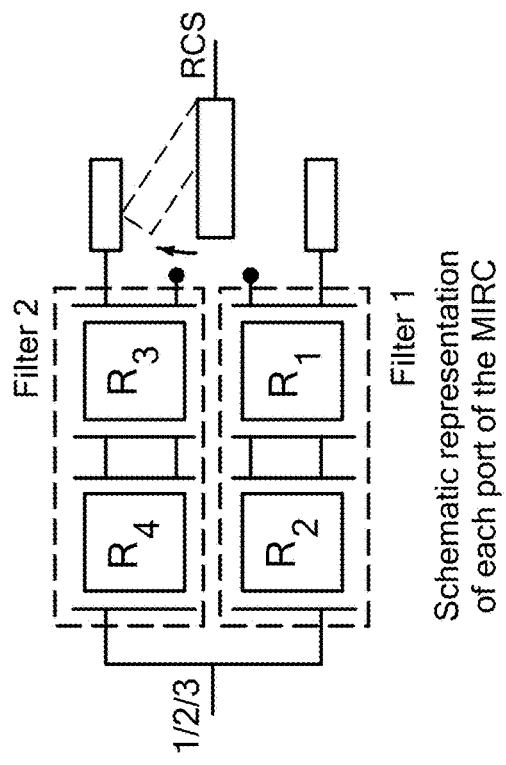
FIG. 2
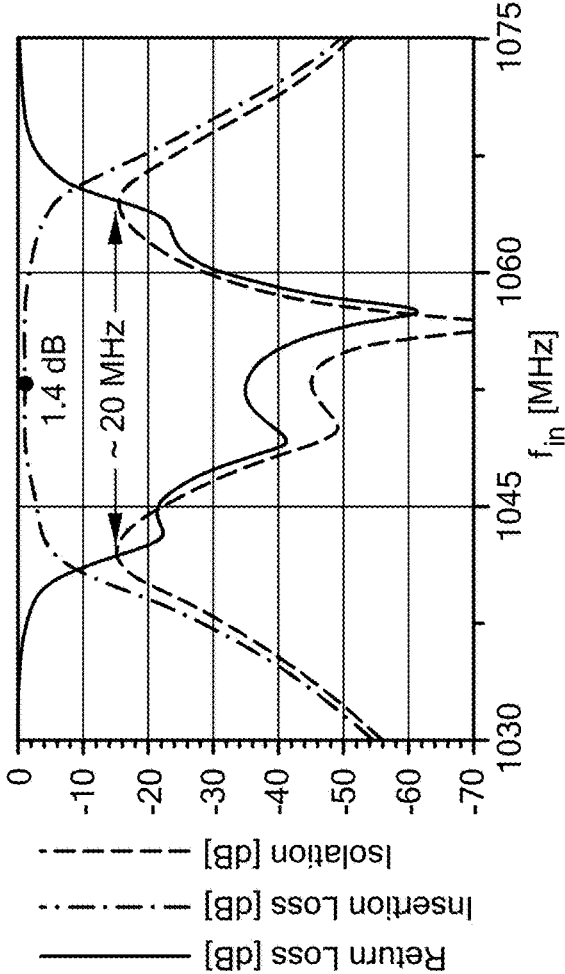
FIG. 3
| | $R_1$ | $R_2$ | $R_3$ | $R_4$ |
|---|---|---|---|---|
| Q | 450 | 450 | 450 | 450 |
| $k_t^2$ [%] | 4.5 | 4.5 | 4.5 | 4.5 |
| $C_0$ [pF] | 3.3 | 3.3 | 3.3 | 3.3 |
| $f_{res}$ [MHz] | 1098 | 1092 | 873 | 869 |
FIG. 4

| | $R_1$ | $R_2$ | $R_3$ | $R_4$ | $R_5$ | $R_6$ |
|---|---|---|---|---|---|---|
| Q | 3000 | 3000 | 3000 | 3000 | 3000 | 3000 |
| $k_t^2$ [%] | 4.5 | 4.5 | 4.5 | 4.5 | 4.5 | 4.5 |
| $C_0$ [pF] | 4.8 | 5 | 4.85 | 4.8 | 5 | 4.85 |
| $f_{res}$ [MHz] | 1098 | 1089 | 1092 | 873 | 866 | 869 |

No displacement in the anchors

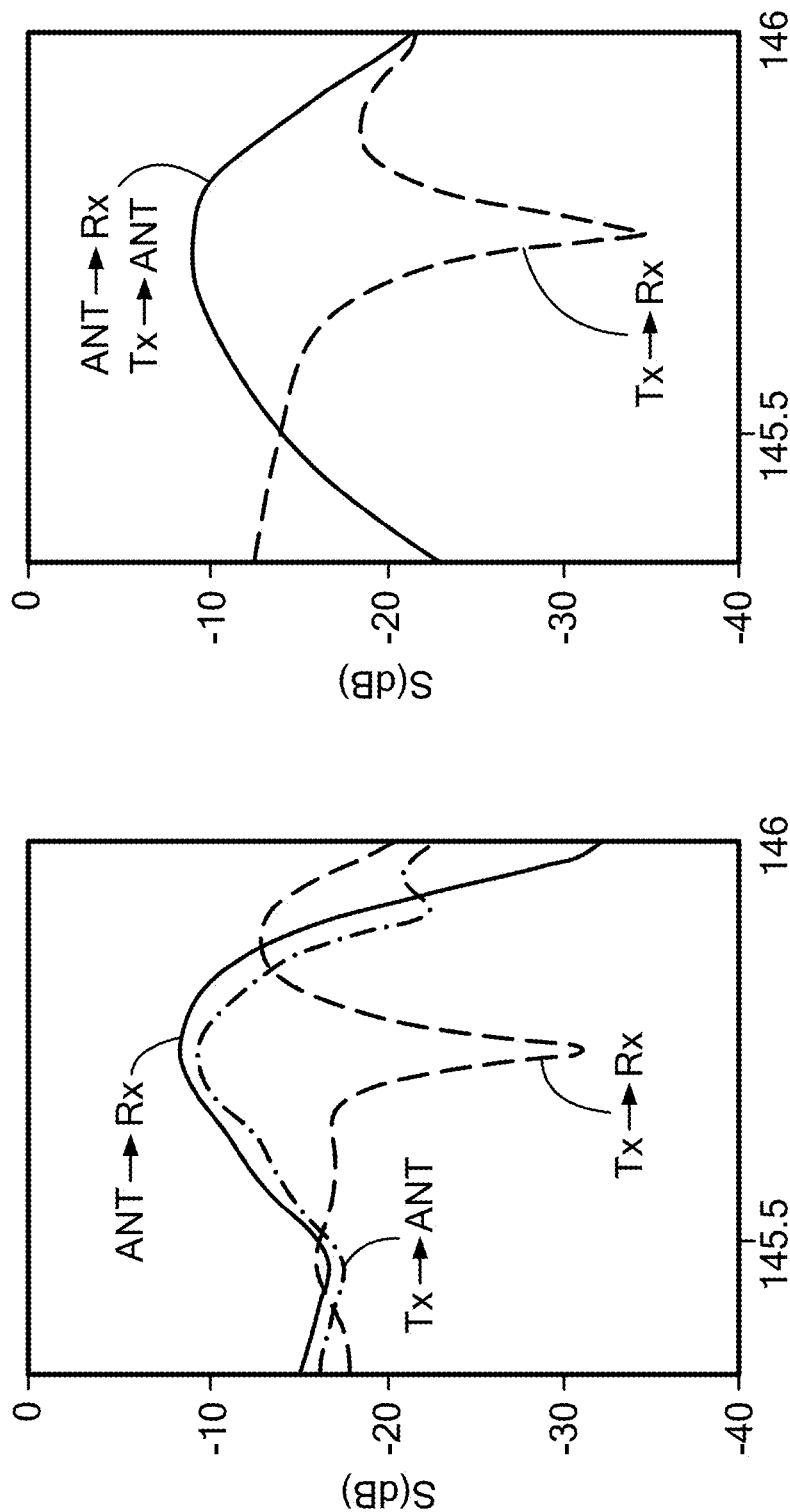

MICROELECTROMECHANICAL RESONANT CIRCULATOR

CROSS REFERENCE TO RELATED APPLICATIONS

This application claims priority under 35 § 119(e) of U.S. Provisional Application No. 62/421,477, filed on Nov. 14, 2016, entitled "Microelectromechanical Resonant Circulator (MIRC)," the disclosure of which is hereby incorporated by reference.

STATEMENT REGARDING FEDERALLY SPONSORED RESEARCH OR DEVELOPMENT

The invention was developed with financial support from No. HR0011-17-2-0002 from DARPA MTO. The U.S. Government has certain rights in the invention.

BACKGROUND

Conventional circulators are based on magnetic biasing and ferromagnetic materials. Despite their maturity and broad availability, conventional magnetic circulators are largely unattractive for integration, due to their bulky dimensions and the incompatibility of the magnetic materials with IC technology. Alternative approaches for magnet-less non-reciprocity based on linear and periodically time-variant circuits require either large modulation frequencies (similar to or even higher than RF frequency), which unavoidably increases the power consumption or the use of off-chip inductors that prevent full miniaturization and integration.

SUMMARY

Embodiments of a magnetic-free radio frequency (RF) microelectromechanical resonant circulator (MIRC) device are described that can be integrated into an integrated circuit. Magnetic-free non-reciprocity is achieved by imparting an effective angular momentum bias to a MEMS (micro electromechanical system) resonant circuit. Embodiments of microelectromechanical resonant circulator (MIRC) devices are provided that include electromechanical resonator elements that are switched to provide frequency commutation. Embodiments of MIRC devices are provided that are capable of achieving high linearity, wide bandwidth, low insertion loss, and high isolation levels. Embodiments of MIRC device are provided that can meet linearity and size requirements for commercial and military applications. Embodiments of MIRC devices use angular-momentum biased circulators relying on highly frequency selective MEMS devices, which can allow the building of high-Q systems and can eliminate the need for large inductors affecting the size and performance of previously developed magneto-free circulators. Embodiments of a MIRC architecture are provided that can achieve modulation frequencies that are orders of magnitude smaller than the state of the art and can eliminate the need for inductors and solid-state varactors.

In some embodiments, two or more MEMS resonators, operating at the same or different frequencies ($f_1$, $f_2$) are commutated over time to form an equivalent resonator network with a resonance frequency or coupling modulated in time. In some embodiments, the angular momentum is efficiently achieved through spatiotemporal modulation of strongly coupled high-Q (>1000) Aluminum Nitride (AlN) Contour Mode MEMS Resonators (CMRs) with signals of the same magnitude. In some embodiments, three CMRs are provided with a phase difference of 120°. In contrast to varactor-based frequency modulation of low-Q LC networks, the spatiotemporal modulation of the high-Q MEMS resonators can be implemented using switch elements, such as switched capacitors, which can minimize the complexity of the modulation network, increase the modulation efficiency, and mitigate the fundamental linearity limitations associated with solid-state varactors. In some embodiments, due to the high Q of the MEMS resonators employed, strong non-reciprocity can be achieved with an ultra-low modulation frequency of ~120 kHz (~0.08% of the RF frequency), which enables a total power consumption of only ~38 µW.

Other aspects of the method and system include the following:

1. A microelectromechanical resonant circulator device comprising:
a substrate, at least three electrical ports supported on the substrate;
at least three electromechanical resonator elements; and
at least three switch elements, each switch element electrically connected between at least one associated electromechanical resonator element and at least one associated port, the switch elements operative to provide commutation over time of the electromechanical resonator elements.

2. The device of embodiment 1, wherein the switch elements are operative to commutate the electromechanical resonator elements over time to form an equivalent resonator network with a resonance frequency or impedance or coupling modulated in time.

3. The device of any of embodiments 1-2, wherein the switch elements are operative to commutate between at least one of a capacitor and a short circuit, a capacitor and an open circuit, an inductor and a short circuit, an inductor and an open circuit, and a short circuit and an open circuit.

4. The device of any of embodiments 1-3, wherein at least one switch element comprises a capacitor in parallel with a switch, an inductor in parallel with a switch, a single pole single throw switch, or a single pole double throw switch.

5. The device of any of embodiments 1-4, wherein the switch elements are operative at a same commutation frequency and shifted in phase or at different commutation frequencies and shifted in phase.

6. The device of any of embodiments 1-5, wherein the switch elements are operative to provide commutation frequencies ranging from 0.001% to 300% of an operating frequency of the circulator device.

7. The device of any of embodiments 1-6, wherein the electromechanical resonator elements are operative at a same frequency or at different frequencies.

8. The device of any of embodiments 1-7, further comprising an inductor disposed in parallel with each electromechanical resonator element.

9. The device of any of embodiments 1-8, wherein the electromechanical resonator elements are connected to a common node.

10. The device of any of embodiments 1-9, wherein the electromechanical resonator elements are connected in a wye configuration, a delta configuration, a hybrid delta-wye configuration, or a differential configuration.

11. The device of any of embodiments 1-10, further comprising at least three additional electromechanical resonator elements connected to form a differential configuration with two branches shifted in phase by 180°.

12. The device of any of embodiments 1-11, wherein each electromechanical resonator element comprises a pair of resonators operative at a same frequency or at different frequencies.

13. The device of embodiment 12, wherein the switch elements are operative to commutate between the resonators of each pair, each resonator pair commutated at a same modulation frequency and shifted in phase.

14. The device of any of embodiments 1-13, wherein one or more electromechanical resonators are disposed to form a filter element at each port, and the switch elements are operative to commutate the filter elements over time to form equivalent filter networks with frequencies or impedances or coupling modulated in time.

15. The device of any of embodiments 1-14, wherein at least one of the electromechanical resonator elements comprises a Cross-sectional Lame Mode Resonator, a Contour-Mode Resonator, a Film Bulk Acoustic Resonator, a Surface Acoustic Wave Resonator, a MEMS (microelectromechanical system) Resonator, a NEMS (nanoelectromechanical system) Resonator, a Bulk Acoustic Wave (BAW) Resonator, a Quartz Crystal Resonator, an electromechanical delay line, or a dielectric resonator.

16. The device of any of embodiments 1-15, wherein at least one electromechanical resonator element comprises:

a piezoelectric layer having a length direction (L), a width direction (W), and a thickness direction (T);

a first conductive layer including at least one first electrode disposed over a top surface of the piezoelectric layer, wherein the top surface extends along the length direction and the width direction; and a second conductive layer including at least one second electrode disposed over a bottom surface of the piezoelectric layer, wherein the bottom surface extends along the length direction and the width direction;

wherein either a vertical-extensional or lateral-extensional or two-dimensional mode of mechanical vibration is excited in a cross sectional plane of the piezoelectric layer in response to at least one signal provided to the at least one first electrode and/or the at least one second electrode.

17. The device of any of embodiments 16, wherein the mode of mechanical vibration in a cross sectional plane of the piezoelectric layer is sensed through the piezoelectrically generated charge collected by the at least one first electrode and/or the at least one second electrode.

18. The device of any of embodiments 16-17, wherein the cross sectional plane extends along the width direction and the thickness direction.

19. The device of any of embodiments 16-18, wherein the frequency of the mode of mechanical vibration is dependent on either the width direction or the thickness direction of the resonator structure or both the width direction and the thickness direction of the resonator structure.

20. The device of any of embodiments 16-19, wherein the piezoelectric layer includes at least one piezoelectric material selected from the group consisting of aluminum nitride, doped aluminum nitride, lithium niobate, lithium tantalate, zinc oxide, gallium nitride, and quartz.

21. The device of any of embodiments 1-20, wherein at least one electromechanical resonator element has a coupling coefficient $k_t^2$ of at least about 0.01%.

22. The device of any of embodiments 1-21, wherein at least one electromechanical resonator element has a quality factor Q of at least 10.

23. The device of any of embodiments 1-22, wherein at least one electromechanical resonator element is suspended from the substrate.

24. The device of any of embodiments 1-23, wherein at least one electromechanical resonator element is supported on the substrate with anchors located at displacement nodes.

25. The device of embodiment 24, wherein displacement at the anchors of at least one electromechanical resonator is near zero.

26. The device of any of embodiments 1-25, wherein at least one port is connectable to an antenna.

27. A method of operating the microelectromechanical resonant circulator device of any of embodiments 1-26, comprising operating the switching elements to commutate the electromechanical resonator elements over time at a determined modulation frequency.

28. A radio transceiver including the microelectromechanical resonant circulator device of any of embodiments 1-26.

29. A non-reciprocal circuit including the microelectromechanical resonant circulator device of any of embodiments 1-26.

DESCRIPTION OF THE DRAWINGS

Reference is made to the following detailed description taken in conjunction with the accompanying drawings in which:

FIG. 2 is a schematic illustration of an embodiment of a MIRC element with second order commutated filters at each port;

FIG. 3 is a graph of simulation results for return loss, insertion loss, and isolation using the second order commutated filters at each port illustrated in FIG. 2;

FIG. 4 is a table of the parameters for the resonators $R_1$, $R_2$, $R_3$, and $R_4$ in FIG. 3;

FIG. 20A is a graph of measured S-parameter (S) of the MIRC prototype illustrating insertion loss from antenna (ANT) to receiver (Rx) and from transmitter (Tx) to ANT, and isolation from Tx to Rx;

FIG. 20B is a graph of simulated S-parameter of the MIRC prototype illustrating insertion loss from antenna (ANT) to receiver (Rx) and from transmitter (Tx) to ANT, and isolation from Tx to Rx;

DETAILED DESCRIPTION

Figure 1:
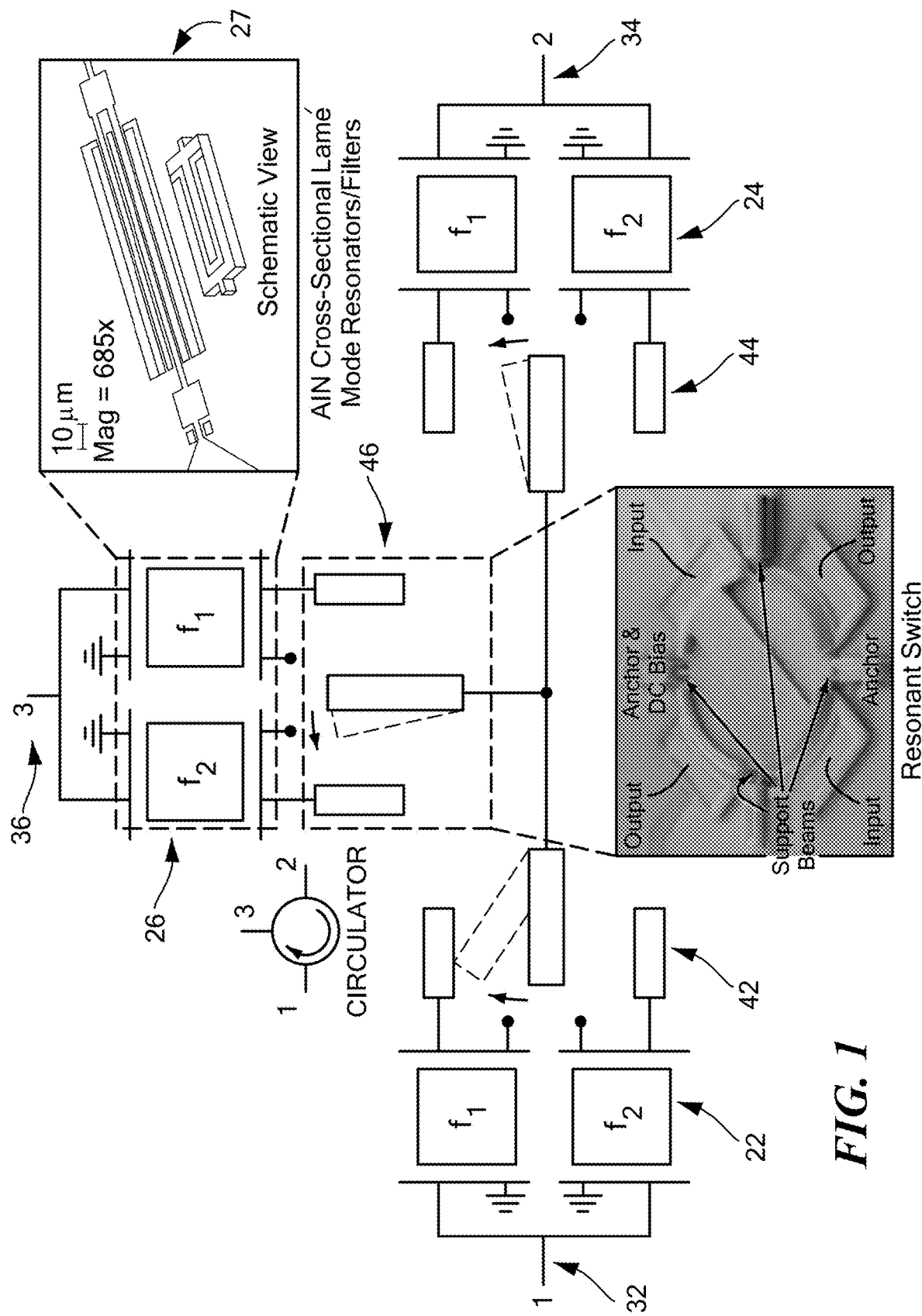
FIG. 1 is a schematic of an embodiment of a microelectromechanical resonant circulator (MIRC) architecture, in which three pairs of commutated MEMS BA-CLMR based filters are connected in a loop, and commutation is implemented by three single pole double throw (SPDT) switches.
Figures 5, 6, 7:
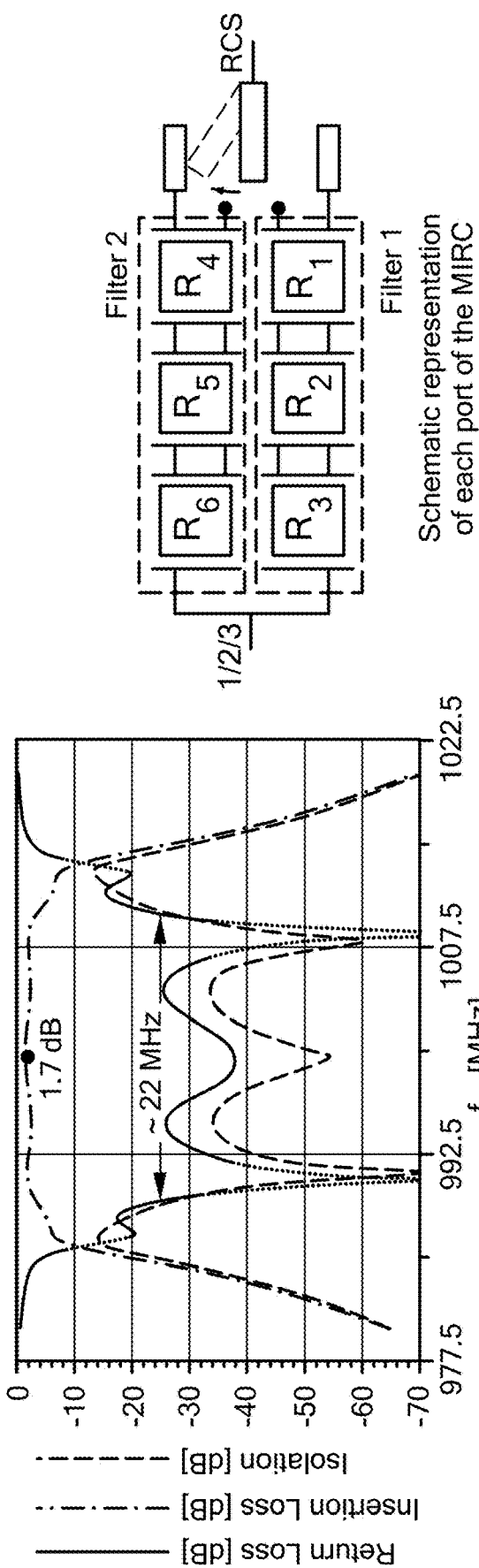
FIG. 5 is a schematic illustration of an embodiment of a MIRC with third order commutated filters at each port.
FIG. 6 is a graph of simulation results for return loss, insertion loss, and isolation using the third order commutated filters at each port illustrated in FIG. 5.
FIG. 7 is a table of the parameters for the resonators $R_1$, $R_2$, $R_3$, $R_4$, $R_5$, and $R_6$ in FIG. 5.

This application incorporates by reference the entire disclosure of U.S. Provisional Application No. 62/421,477, filed on Nov. 14, 2016, entitled "Microelectromechanical Resonant Circulator (MIRC)."

In some embodiments, a microelectromechanical resonant circulator (MIRC) device can include a substrate, with at least three electrical ports supported on the substrate. The device includes at least three electromechanical resonator elements and at least three switch elements. Each switch element can be electrically connected with an associated electromechanical resonator element and an associated port. The switch elements are operative to provide commutation over time of the electromechanical resonator elements. The electromechanical elements can be provided in a variety of topologies, examples of which are described further below.

The switch elements are operative to commutate the electromechanical resonator elements over time to form an equivalent resonator network with a resonance frequency or coupling or impedance modulated in time. The switch elements can be operative at a same commutation frequency and shifted in phase or at different modulation frequencies and shifted in phase. In some embodiments, the switch elements are operative to provide commutation frequencies ranging from 0.001% to 300% of the operating frequency of the circulator device. In some embodiments, the switch elements are operative to provide commutation frequencies ranging from 0.01% to 200% of the operating frequency of the circulator device. In some embodiments, the switch elements can be operative to commutate between at least one of a capacitor and a short circuit, a capacitor and an open circuit, an inductor and a short circuit, an inductor and an open circuit, and a short circuit and an open circuit.

The switch elements can be implemented by any suitable switching technology and can be controlled in any suitable manner. In some embodiments, the switch elements can be a capacitor in parallel with a switch, an inductor in parallel with a switch, a single pole single throw switch, or a single pole double throw switch.

Any suitable electromechanical resonator can be used, including a Cross-sectional Lame Mode Resonator, a Contour-Mode Resonator, a Film Bulk Acoustic Resonator, a Surface Acoustic Wave Resonator, a MEMS (microelectromechanical system) Resonator, a NEMS (nanoelectromechanical system) Resonator, a Bulk Acoustic Wave (BAW) Resonator, a Quartz Crystal Resonator, an electromechanical delay line or a dielectric resonator.

The electromechanical resonator elements can be operative at a same frequency or at different frequencies. In some embodiments, an inductor can be disposed in parallel with each electromechanical resonator element. In some embodiments, the electromechanical resonator elements are connected to a common node.

The electromechanical resonator elements can be connected in a variety of topologies. In some embodiments, the electromechanical resonator elements are connected in a wye configuration, a delta configuration, a hybrid delta-wye configuration, or a differential configuration. In some embodiments, at least three additional electromechanical resonator elements are provided to form a differential configuration with two branches shifted in phase by 180°.

In some embodiments, each electromechanical resonator element comprises a pair of resonators operative at a same frequency or at different frequencies. The switch elements can be operative to commutate between the resonators of each pair, each resonator pair commutated at a same modulation frequency and shifted in phase.

In some embodiments, one or more electromechanical resonators are disposed to form a filter element at each port, and the switch elements are operative to commutate the filter elements over time to form equivalent filter networks with frequencies or impedances or coupling modulated in time.

In some embodiments, one or more of the electromechanical resonator elements can include a piezoelectric layer having a length direction (L), a width direction (W), and a thickness direction (T). A first conductive layer can include at least one first electrode disposed over a top surface of the piezoelectric layer, wherein the top surface extends along the length direction and the width direction. A second conductive layer can include at least one second electrode disposed over a bottom surface of the piezoelectric layer, the bottom surface extending along the length direction and the width direction. A vertical-extensional or lateral-extensional or two-dimensional mode of mechanical vibration can be excited in a cross sectional plane of the piezoelectric layer in response to at least one signal provided to the at least one first electrode and/or the at least one second electrode. The mode of mechanical vibration in a cross sectional plane of the piezoelectric layer can be sensed through the piezoelectrically generated charge collected by the at least one first electrode and/or the at least one second electrode. The cross sectional plane can extend along the width direction and the thickness direction. The frequency of the mode of mechanical vibration can be dependent on either the width direction or the thickness direction of the resonator structure or both the width direction and the thickness direction of the resonator structure. The piezoelectric layer can include at least one piezoelectric material selected from the group consisting of aluminum nitride, doped aluminum nitride, lithium niobate, lithium tantalate, zinc oxide, gallium nitride, and quartz.

In some embodiments, one or more of the electromechanical resonator elements has a coupling coefficient $k_t^2$ of at least about 0.01%. In some embodiments, one or more of the electromechanical resonator elements has a coupling coefficient $k_t^2$ of at least about 0.1%. In some embodiments, one or more of the electromechanical resonator elements has a quality factor Q of at least 10.

In some embodiments, one or more of the electromechanical resonator elements is suspended from the substrate. In some embodiments, one or more of the electromechanical resonator elements is supported on the substrate with anchors located at displacement nodes. In some embodiments, displacement at the anchors of at least one electromechanical resonator is near zero. Anchors at the displacement nodes can assist in minimizing anchor dissipation, enabling better heat flow towards the substrate, which can increase the linearity achievable by the resonator element.

Nano and micro-electromechanical resonators including Cross-sectional Lame Mode Resonator are described further in U.S. Pat. No. 9,419,583, issued Aug. 16, 2016, incorporated by reference herein.

The use of low-loss piezoelectric MEMS resonators in angular-momentum biased circulators requires strategies to modulate their operating frequencies. To tune piezoelectric resonators, two methods are known: one relies on device ovenization, whereas the other makes use of tunable capacitive loading. Neither of these methods is desirable to achieve the desired tuning range and speed for a MIRC device, and could lead to poor isolation and large insertion loss. To overcome such limitations and enable the use of high-Q MEMS resonators in angular-momentum biased circulators, the MIRC devices described herein do not require frequency tuning of each individual MEMS resonator; instead, embodiments of the MIRC devices are based on the use of one or more MEMS resonators, operating at the same or different frequencies ($f_1$, $f_2$) and commutated over time to form an equivalent resonator network with a resonance frequency or impedance or coupling modulated in time.

Referring to FIG. 1, an embodiment of a MIRC device 10 is illustrated that employs a resonator element 22, 24, 26 at each of three ports 32, 34, 36, each resonator element in series with a switch element 42, 44, 46 to control the commutation. In the embodiment illustrated, each resonator element can include a pair of commutated BA-CLMR filters 27, described further below.

In this configuration, the commutation period ($T_m$) sets the modulation frequency (i.e., $T_m=1/f_m$) of the equivalent resonator network, while the difference between the resonance frequencies of the two commutated resonators, $\Delta f = f_1 - f_2$, and the modulation duty cycle set the amplitude of the equivalent frequency or coupling modulation. Switch elements can be introduced near (e.g., behind) the resonators and connected to the common node, allowing the switch elements to break the resonance degeneracy at the common node and enabling large non-reciprocal responses. Circuit analysis and simulations show that, under these conditions, it is possible to ideally replace a single resonator with resonance frequency modulated with switchable pairs of resonators. Analysis also shows that such a modulation is analogous to a sinusoidal modulation of the resonance frequency of one resonator for the purpose of breaking reciprocity. The commutation can be implemented using switches, driven by the same modulation frequency, but properly phase-shifted to enable electronic rotation of the loop and therefore a drastic break of reciprocity in the system.

In some embodiments, in analogy with the architecture in FIG. 1, angular-momentum biasing can be achieved through a network of three identical pairs of commutated MEMS resonators, strongly coupled with each other and commutated at the same frequency $f_m$ but with a phase difference of 120°.

In some embodiments, a wider operation bandwidth can be attained through the commutation of filters on behalf of singular resonators, in which MEMS resonators can be coupled to form a pair of commutated filters at each port. As demonstrated further below, the use of commutated filters enables the widening of the circulator bandwidth while maintaining low loss and high isolation.

Figure 16:
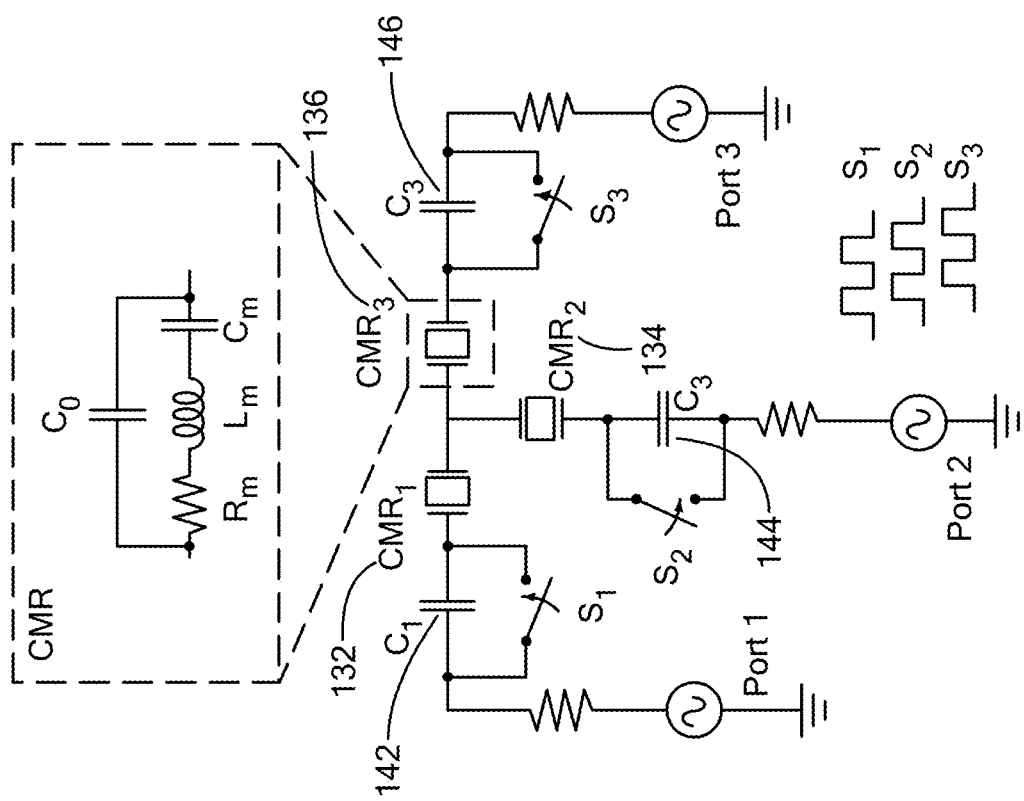
FIG. 16 is a schematic circuit diagram of a further embodiment of a MIRC device.

A further embodiment of a magnetic-free radio frequency (RF) Microelectromechanical Resonant Circulator (MIRC) is described with reference to FIG. 16. FIG. 16 illustrates three CMRs 132, 134, 136 implemented in a wye topology. Magnetic-free non-reciprocity can be achieved by imparting an effective angular momentum bias to a MEMS resonant circuit through spatiotemporal modulation of three strongly coupled high-Q (>1000) Aluminum Nitride (AlN) Contour Mode MEMS Resonators (CMRs) with signals of the same magnitude and phase difference of 120°. In this embodiment, the spatiotemporal modulation of the high-Q MEMS resonators is implemented by switched capacitors 142, 144, 146, which can minimize the complexity of the modulation network, increase the modulation efficiency, and mitigate the fundamental linearity limitations associated with solid-state varactors. Due to the high Q of the MEMS resonators employed, strong non-reciprocity can be achieved with an ultra-low modulation frequency of ~120 kHz (~0.08% of the RF frequency), which enables a total power consumption of only ~38 µW. This is believed to be the lowest power consumption reported for magnetic-free RF circulators based on temporally modulated circuits.

Figure 22:
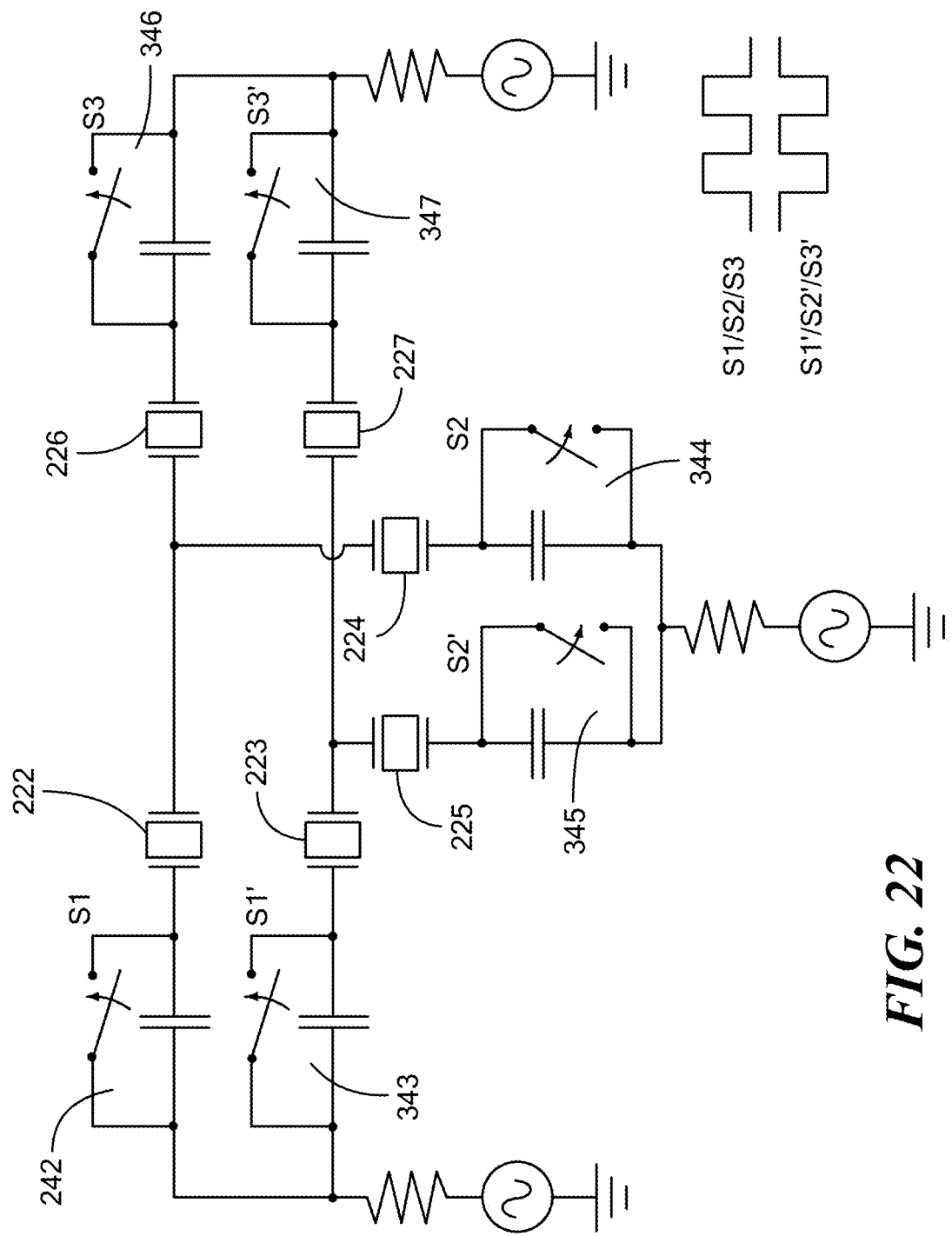
FIG. 22 is a schematic circuit diagram of an embodiment a MIRC device employing a differential circuit, including an additional resonator at each port commutated with a 180° phase difference.

A further embodiment implementing a differential wye topology that employs six CMRs 222-227 is illustrated in FIG. 22. Each associated switching element 242-247 includes a switched capacitor, a properly sized capacitor in parallel with each switch, whereby the circuit is never open, such that sufficient modulation amplitude can be achieved. This differential topology can result in suppression of IM products. In some embodiments, one-port resonators can be used, and in some embodiments, two-port resonators can be used.

A still further embodiment implements a differential hybrid topology in which two sets 322, 324 of three CMRs are implemented in a delta configuration, and switch elements 342-347 of switched capacitors are implemented in a wye configuration. See FIG. 36.

Embodiments of MIRC devices described herein can provide a number of advantages. The MIRC device can enable lower insertion-loss, higher power handling, a higher degree of miniaturization and a lower power consumption than conventional magneto-free circulators based on angular momentum bias. The use of commutated frequency selective microelectromechanical resonators can enable the achievement of a large harmonic rejection, thus enabling higher power handling than traditional magneto-free circulators based on lumped components. The break of reciprocity is not attained through direct modulation of the resonance frequency of one resonator/filter, as such an approach would not be applicable to MEMS resonators. In contrast, reciprocity is broken through the use of commutated resonators/filters. The commutation can be implemented through any type of switch. The use of commutated MEMS filters with high skirt steepness in MIRC enables the adoption of circulators in multi-band RF platforms that recur to frequency duplex multiplex (FDM) to achieve higher spectral efficiency and a large data-rate. The adoption of BA-CLMRs enables the achievement of high power handling and high performance suspended MEMS resonators through the mitigation of their thermal nonlinearities.

Current magnetic-free circulators rely on lumped low quality factor (Q) LC-tanks. Such components cannot achieve the high performance integrated miniaturized circulators for multi-band radios or radio transceivers required by many commercial and military telecommunication platforms, which can, in contrast, be achieved with embodiments of the disclosed BA-CLMRs.

The special displacement modal distribution of BA-CLMRs enables the use of more anchors without affecting their electromechanical performance. This permits embodiments of the circulator to achieve a better heat flow from the body towards the substrate, thus enabling higher power handling than conventional suspended MEMS resonators.

The development of BA-CLMRs enables the achievement of wide-band, high power handling and highly frequency selective circulators for integrated telecommunication platforms.

Embodiments of the devices disclosed herein can be used in the development of multi-band radios adopting integrated circulators to achieve higher spectral efficiency, lower power consumption and a larger immunity to interferences. Embodiments can be used in reconfigurable nonreciprocal circuits for integrated computing platforms.

EXAMPLES

Example 1

To demonstrate the functionality of the proposed approach, the performance of a MIRC architecture based on high electromechanical coupling coefficient ($k_t^2$) shown in FIGS. 1-7 was evaluated by harmonic balance simulations and periodic steady state Spectre analyses based on the time domain shooting engine. The network includes three identical pairs of commutated BA-CLMR filters (one at each of three 50Ω terminated ports), strongly coupled with each other and commutated at the same frequency ($f_m$) but with a phase difference of 120°. The equivalent circuit parameters of each 2-port BA-CLMR forming the filters were computed assuming realistic values of static capacitance, $C_0$, electromechanical coupling coefficient, $k_t^2$, and quality factor, Q, reported in the tables in FIGS. 4 and 7. The simulation results indicate that the use of such high Q MEMS resonators enables the achievement of low loss and high isolation but, at the same time, it also limits the isolation bandwidth. This is due to the high frequency sensitivity of the Voltage Standing Wave Ratio (VSWR), at the isolated port, when high Q tanks are used. Therefore, in order to increase the isolation bandwidth, without reducing the Q of the resonators (hence the insertion loss for the same bandwidth), the number of poles in the transfer function of each filter is increased, as this reduces the overall frequency sensitivity of the VSWR at the isolation port. The simulations (FIGS. 2-7) show that by increasing the order of the commutated filters it is possible to simultaneously reduce the insertion loss and increase the isolation bandwidth.

Example 2

Figure 8:
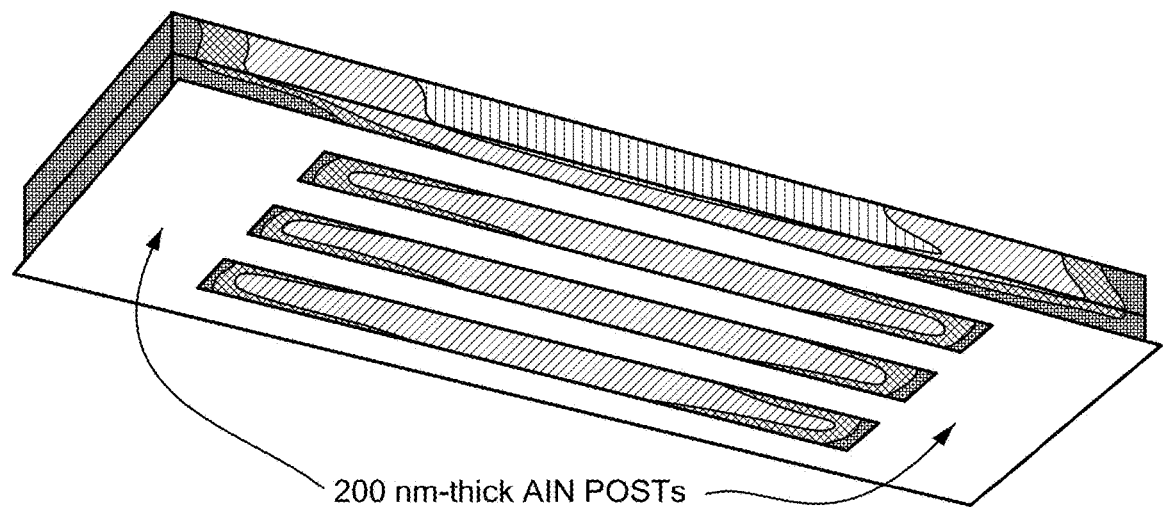
FIG. 8 illustrates a three-dimensional finite element method (FEM) simulated temperature profile of an embodiment of a BA-CLMR device.
Figure 9:
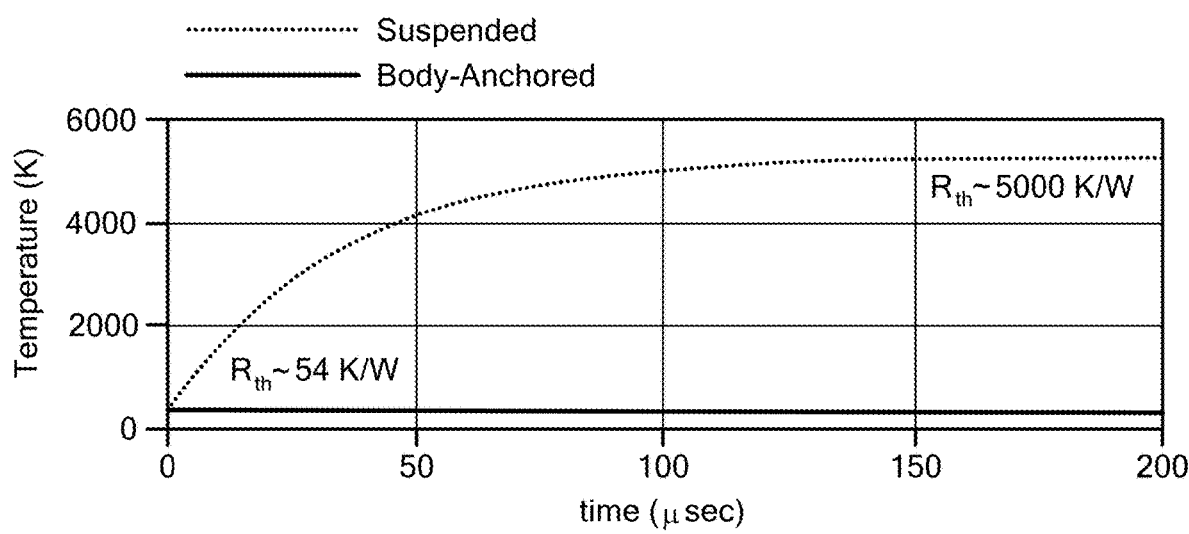
FIG. 9 is a graph of three-dimensional FEM simulated temperature rise versus time for an embodiment of the BA-CLMR device of FIG. 8 (termed "body-anchored") and a CLMR suspended device.
Figure 10:
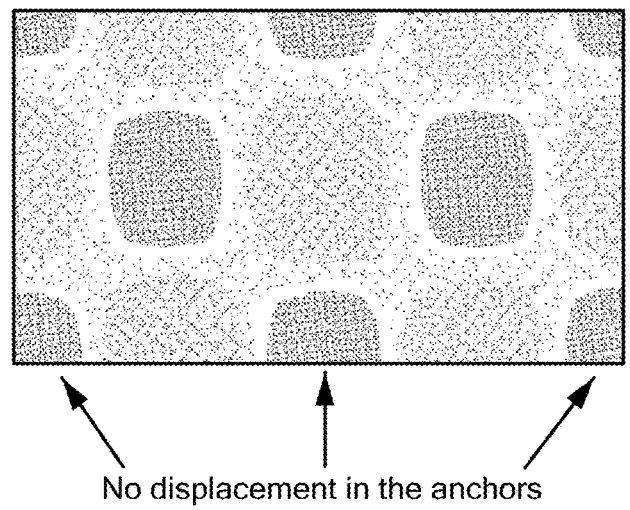
FIG. 10 is a two-dimensional FEM simulated mode of vibration of an embodiment of the BA-CLMR device of FIG. 8.
Figure 11:
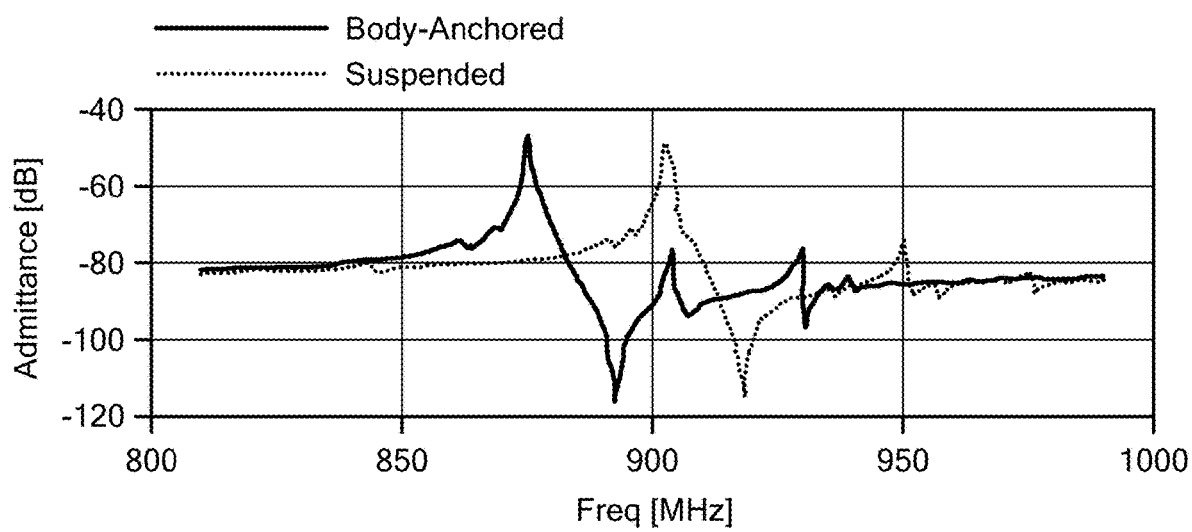
FIG. 11 is a graph of a three-dimensional FEM simulated admittance amplitude of the BA-CLMR device of FIG. 8 (termed "body-anchored") and a suspended CLMR device.
Figure 12:
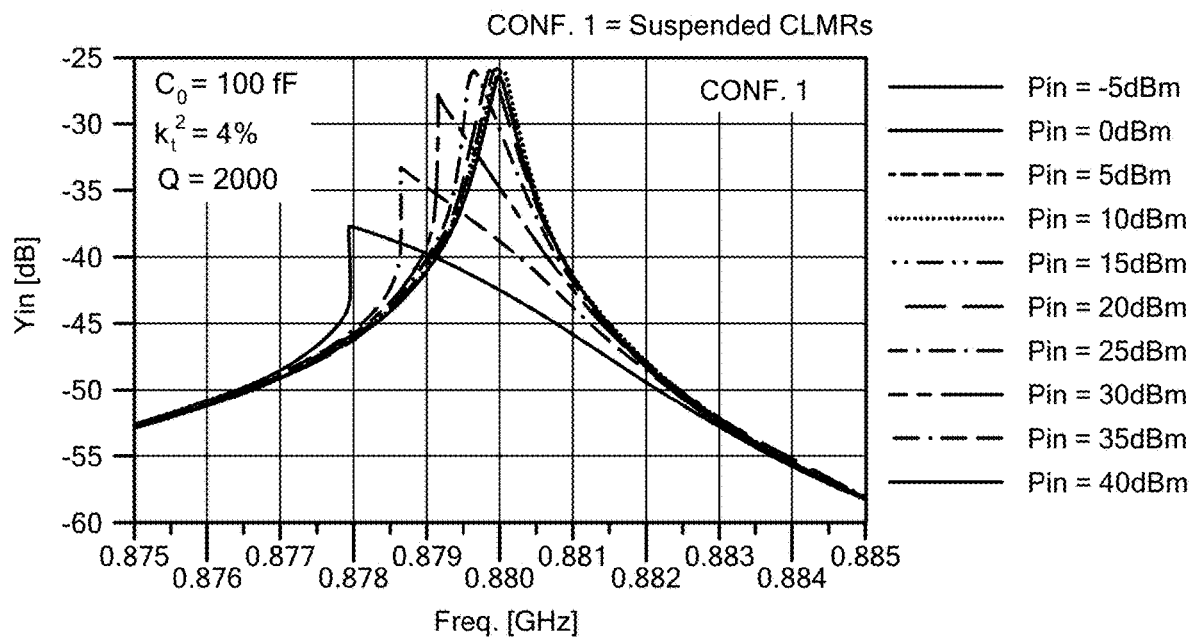
FIG. 12 is a graph of simulated large-signal admittance responses vs. frequency for a suspended CLMR device for different input power levels ($P_{in}$)
Figure 13:
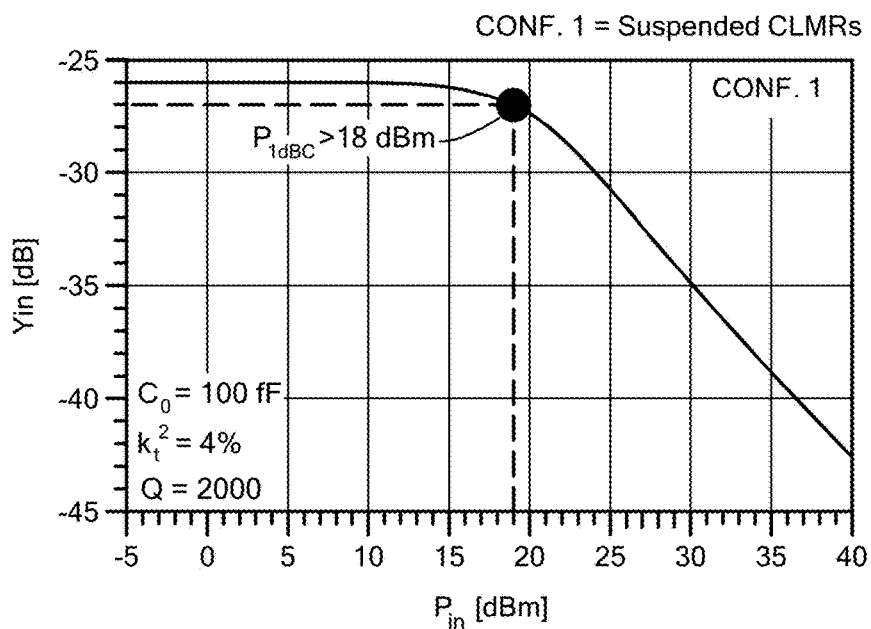
FIG. 13 is a graph of admittance levels at resonance for $P_{in}$ between −5 and 40 dBm for the suspended CLMR device.
Figure 14:
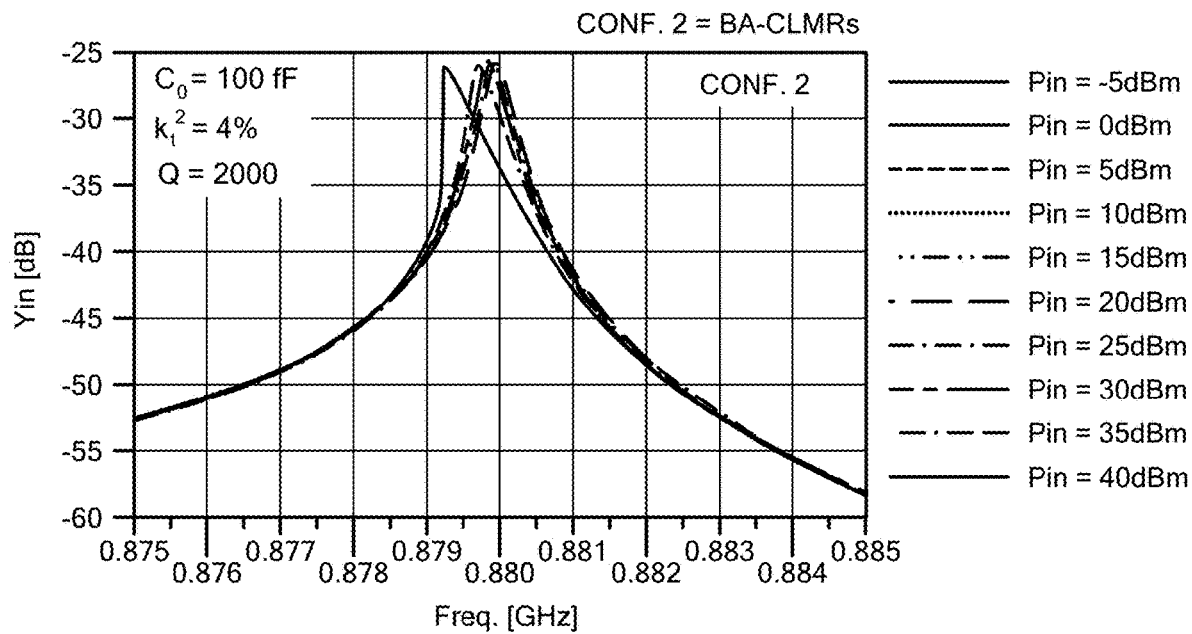
FIG. 14 is a graph of simulated large-signal admittance responses vs. frequency for the BA-CLMR device of FIG. 8 for different input power levels ($P_{in}$)
Figure 15:
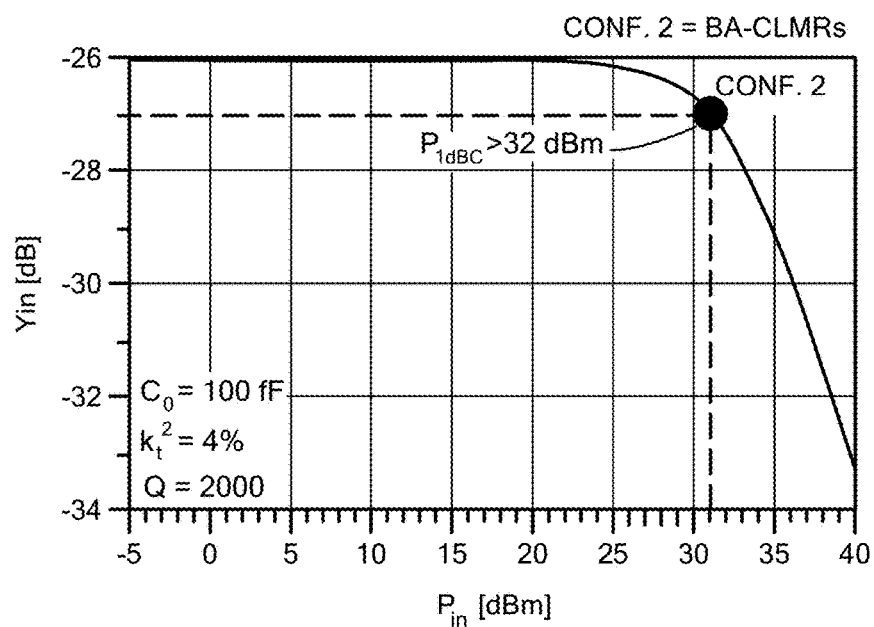
FIG. 15 is a graph of admittance levels at resonance for $P_{in}$ between −5 and 40 dBm for the BA-CLMR device.

In some embodiments, the core element of MIRC is a high coupling and high power handling MEMS resonator. AlN body-anchored cross-sectional Lame Mode Resonators (BA-CLMR) characterized by high electromechanical performance (coupling coefficient $k_t^2$>4% and Q>1000) and high power handling capability (P1 dB~36 dBm) are suitable to form the resonant elements in a MIRC device. The CLMR technology relies on a coherent combination of the $d_{31}$ and $d_{33}$ piezoelectric coefficients of AlN to transduce a 2-dimensional (2D) mechanical mode of vibration, which is characterized by longitudinal vibrations along both the width and the thickness of the AlN plate. This feature enables the implementation of resonators with high values of coupling coefficient $k_t^2$ as high as 7%. Despite these advantages, CLMRs (and in general any MEMS resonators) are characterized by limited linearity and power handling capability. The main source of non-linearity in this class of AlN MEMS piezoelectric resonators is attributed to the softening of the equivalent Young's modulus due to self-heating of the suspended piezoelectric resonant structure. To address this limitation, the CLMRs can be strategically anchored to the substrate to maximize heat dissipation to the heat sink (substrate) while maintaining high electromechanical coupling and confinement of the acoustic energy in the vibrating body of the structure (high Q). This is enabled by the two-dimensional displacement profile of the Lame mode excited in the cross-section of the AlN plate which is characterized by vibration nodes distributed along the bottom surface of the AlN plate. A simulated analysis through Finite Element Methods (FEM) shows that, by anchoring the device along the nodes of the 2D vibrational mode, the overall thermal resistance of the structure can be lowered by at least 2 orders of magnitude, compared to conventional devices, since ~40% of the device volume is solidly mounted and thermally connected to the Si substrate (the heat sink) instead of being physically separated and thermally isolated from it by an air gap. (FIG. 8) FIG. 9 illustrates a three-dimensional (3D) FEM simulated temperature rise versus time for a body-anchored and a suspended device. A ~100× reduction in thermal resistance was recorded for the BA-CLMR. Simultaneously, high electromechanical coupling and confinement of the acoustic energy in the vibrating body of the structure are maintained since a near-zero force is applied to the anchors during the oscillation cycle, which minimizes any damping associated with the anchors. (FIG. 10) FIG. 11 is a graph of a 3D FEM simulated admittance amplitude for a body-anchored and a suspended device. Spurious suppression and unchanged electromechanical coupling was recorded for the BA-CLMR.

In FIG. 12-15, the simulated admittance curves of a suspended CLMR and a BA-CLMR are compared, with same lateral dimensions and TCF values (measured to be −21 ppm/° K), for different input power-levels ($P_{in}$). As is evident from FIGS. 13 and 15, the 1 dB compression point of the BA-CLMR is 14 dB higher than the CLMR. Notably, unlike conventional solidly mounted Film Bulk Acoustic Resonators (FBARs) BA-CLMRs do not require an acoustic mirror to confine the acoustic energy in resonator (which degrades both Q and $k_t^2$ of the device), and still guarantees lithographic frequency tuning.

Example 3

A MIRC prototype has been fabricated based on the embodiment of FIG. 16 using three 146 MHz AlN CMRs (monolithically integrated on the same chip showing $k_t^2$~1.7%, Q~1000) connected in a loop and frequency commutated by means of series switched capacitors mounted on a PCB (FIGS. 17, 18) and electrically connected to the MEMS chip by wire bonding. The three switched capacitors were controlled by 120 kHz square wave signals of equal amplitude and phase difference of 120° to impart an effective angular momentum bias, which breaks reciprocity and time reversal symmetry.

Figure 17:
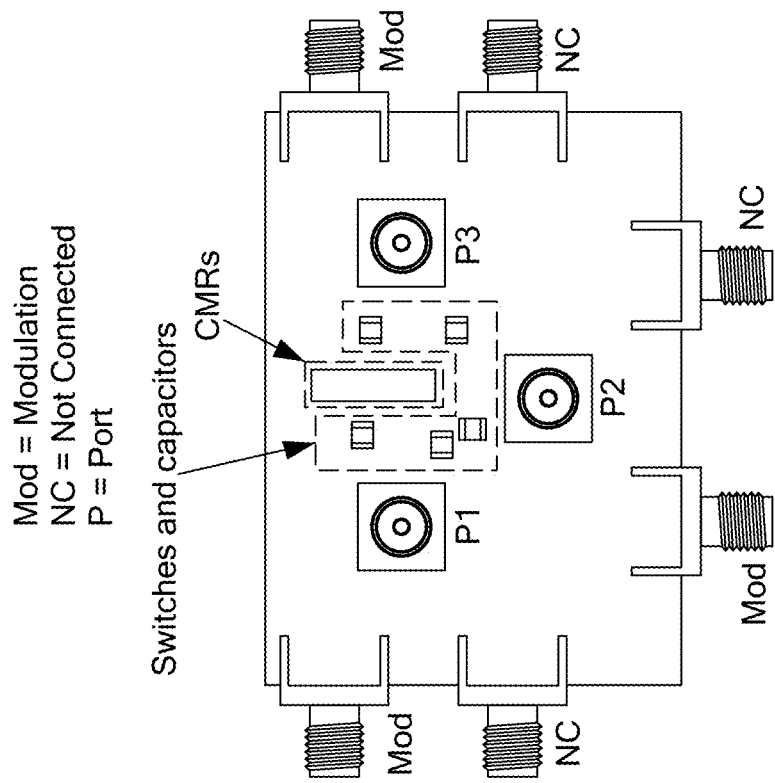
FIG. 17 is an illustration of a PCB layout of the MIRC prototype employing the architecture of FIG. 16.
Figure 19:
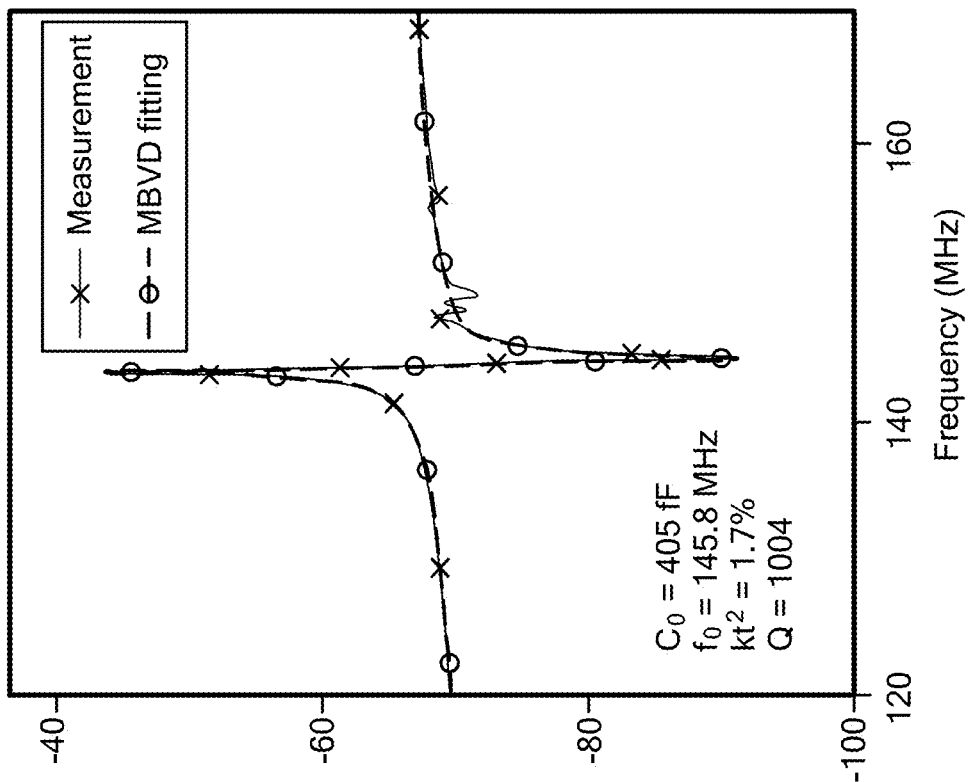
FIG. 19 is a graph of a MBVD fitting of measured admittance of one CMR of the prototype.
Figure 18:
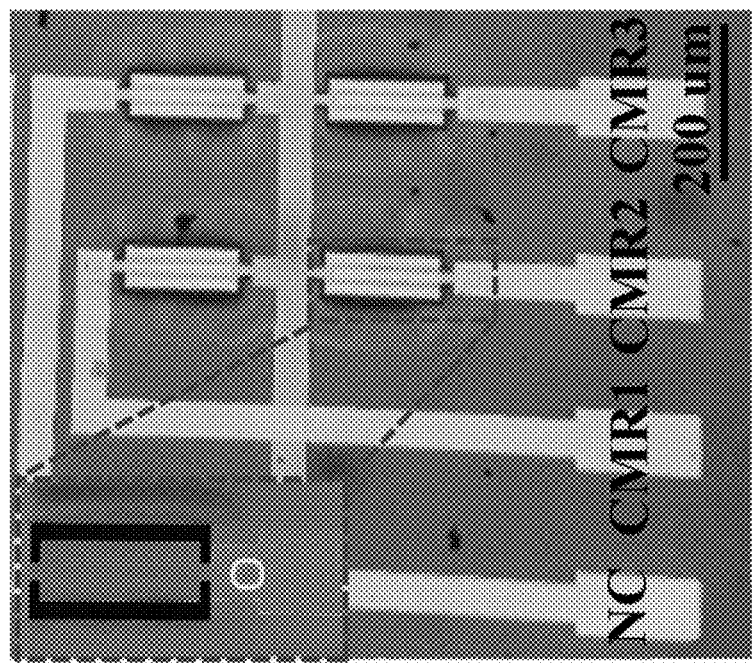
FIG. 18 is an illustration of a high Q AlN CMR array used in the MIRC prototype of FIG. 17.

Solid-state GaN RF switches were used to implement the switched-capacitors system providing large modulation amplitude and mitigating linearity limitations associated with more conventional solid-state varactors. The properly phase shifted commutation signals were produced by three synchronized signal generators. FIG. 17 illustrates the MIRC PCB layout. FIG. 18 illustrates the high Q AlN CMR array used in this MIRC prototype. Three CMRs composing the array share one common terminal. The inset in FIG. 18 is an SEM image of one CMR in the array. FIG. 19 illustrates MBVD fitting of the measured admittance of one CMR.

The performance of the prototype was evaluated by measuring its S-parameters using a 4-port vector network analyzer. As predicted by circuital simulations, strong non-reciprocity (~30 dB isolation between transmit and receive ports) was achieved at ~145 MHz with a modulation frequency of only 120 kHz (FIGS. 20A, 20B). FIG. 20A illustrates measured S-parameters (S) of the MIRC prototype: insertion loss from Antenna (ANT) to Receiver (Rx) and from Transmitter (Tx) to ANT, and isolation from Tx to Rx are shown. FIG. 20B illustrates simulated S-parameters of the MIRC. The slight difference between simulation and experimental results can be attributed to minimal fabrication mismatches between the three resonators and parasitic capacitance associated with the PCB implementation.

Figure 21:
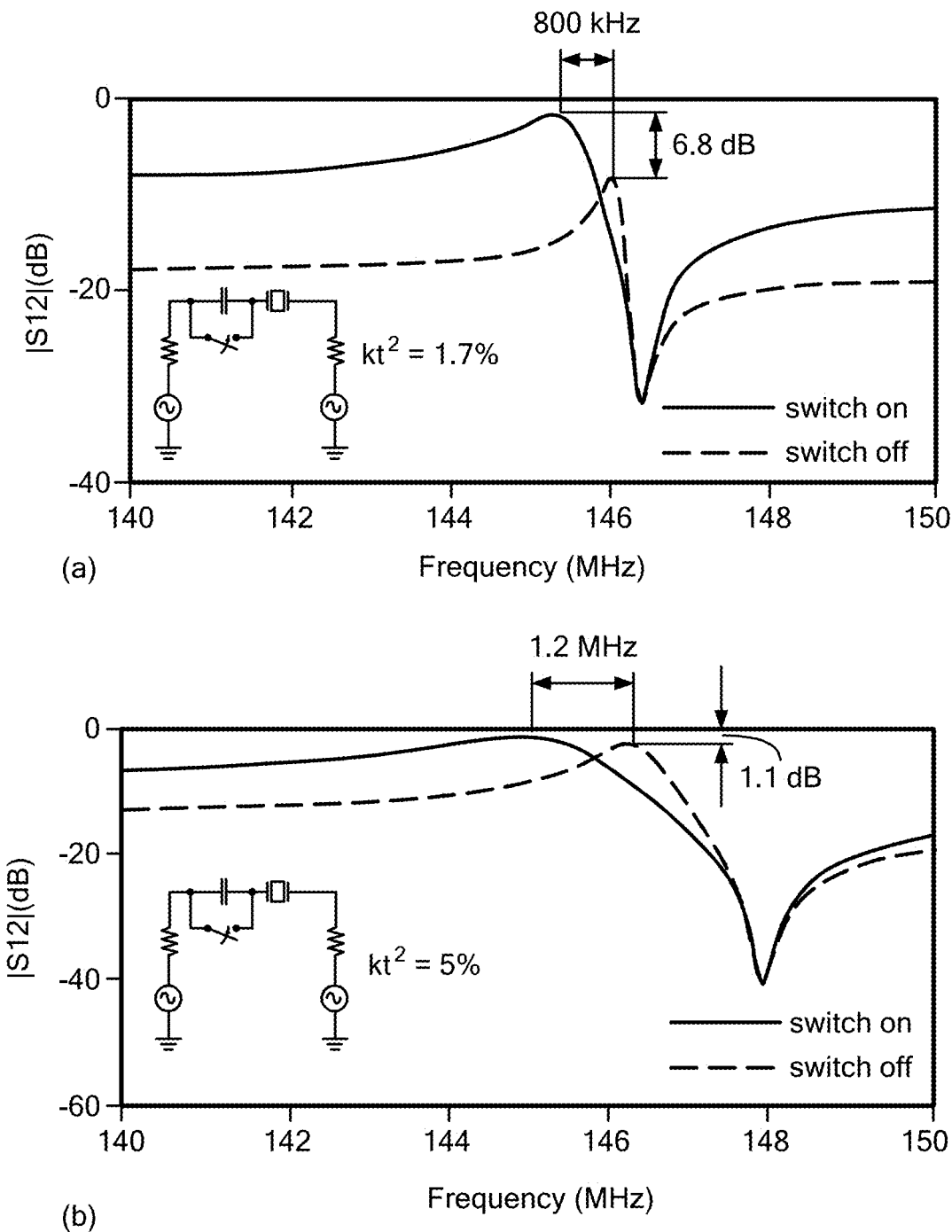
FIG. 21 is a graph of a static simulation of two CMRs, with different $k_t^2$, in series to the switched capacitor that guarantees optimal MIRC performance, using a simulation circuit as illustrated schematically in the inset.

The relatively high insertion loss (IL~8 dB) of this prototype is due to the relatively large variation of the resonator impedance amplitude over the commutation period (FIG. 21) and the relatively low FoM ($k_t^2 \cdot Q$~17) of the CMRs employed. These figures illustrate static simulation of two CMRs, with different $k_t^2$, in series to the switched capacitor that guarantees optimal MIRC performance. The insets illustrate the simulation circuit schematic. FIG. 21(a) illustrates simulation results for a CMR with $k_t^2$=1.7%. When the switch is off, the center frequency of the resonator has been shifted by 800 kHz, and the resonance admittance amplitude has been reduced by 6.8 dB. FIG. 21(b) illustrates simulation results for a CMR with $k_t^2$=5%. The center frequency of the resonator has been shifted by 1.2 MHz, and the resonance admittance amplitude has been reduced by only 1.1 dB.

Example 4

Figures 23A, 23B:
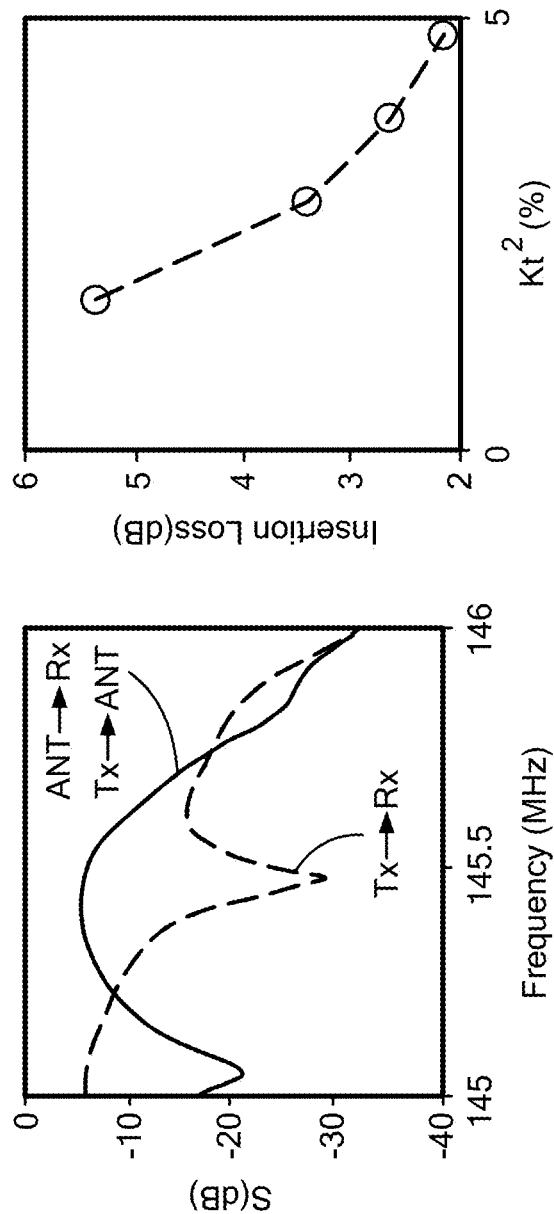
FIG. 23A is a graph of simulated S-parameters of the differential topology of the circuit of FIG. 22.
FIG. 23B is a graph of a simulated relationship between the MIRC IL and the CMR $k_t^2$.

Circuital simulations show that the insertion loss IL can be improved by ~3 dB by implementing a differential wye configuration, such as that shown in FIG. 22. Simulations show that IL as low as 2 dB can be achieved by employing resonators with same Q and reasonably higher $k_t^2$~5%, which is achievable using AlN Cross-Sectional Lame Mode Resonators. See FIGS. 23A, 23B.

Example 5

Figure 24:
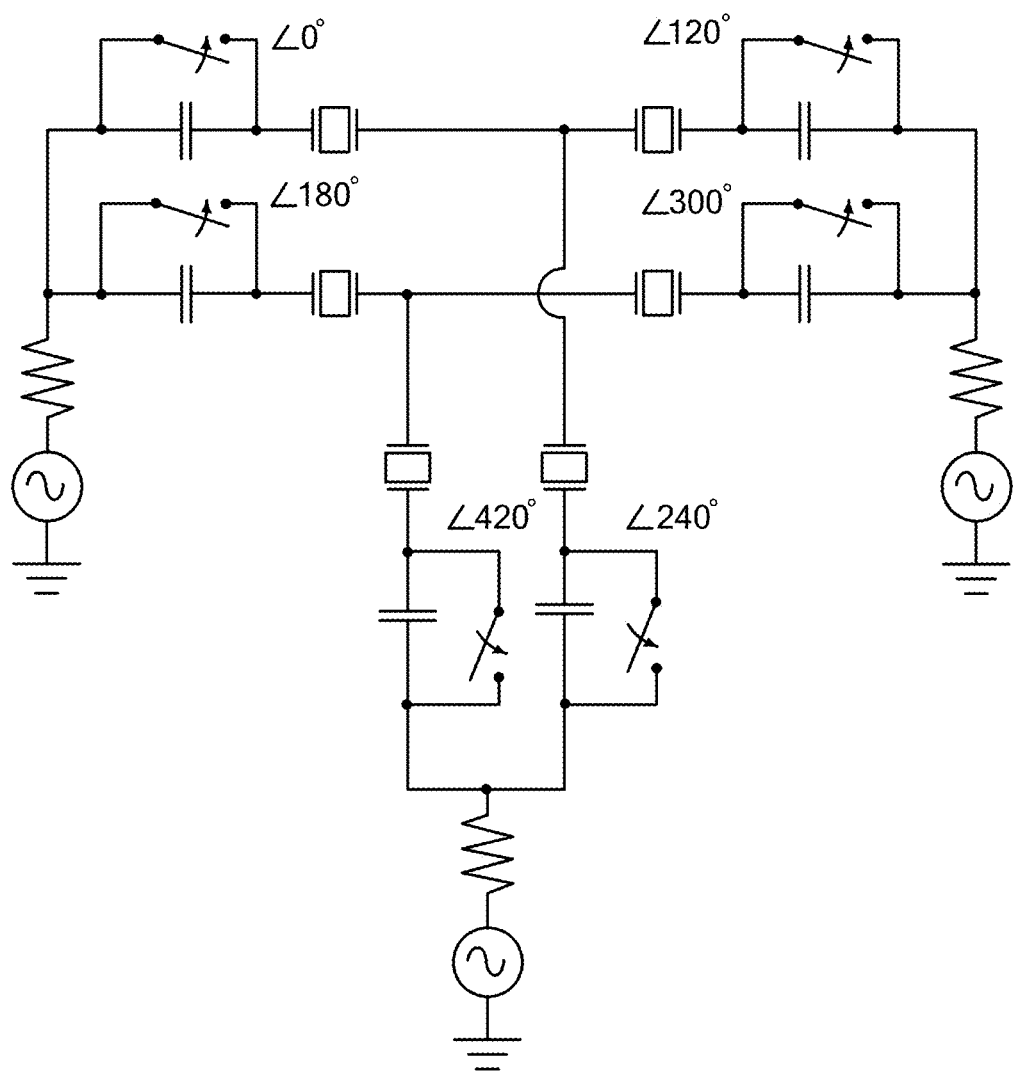
FIG. 24 is a schematic circuit diagram of an embodiment of a MIRC device employing a differential wye topology indicating phase shifted values.
Figure 25:
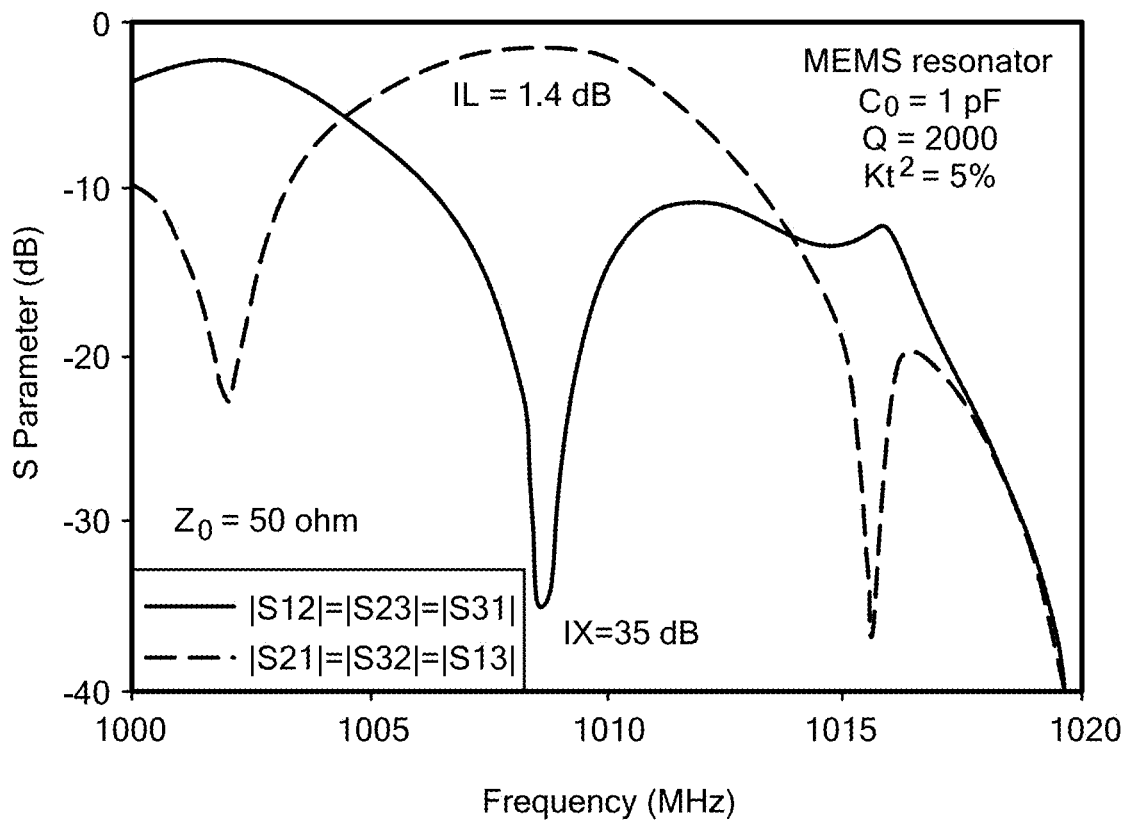
FIG. 25 is a graph of simulation results of S parameters (insertion loss and isolation) vs. frequency for the device of FIG. 24.

FIG. 25 illustrates a graph of simulated S parameters vs. frequency of the MIRC differential wye topology of FIG. 24 with each resonator being characterized by $C_0$=1 pF, Q=2000, and $k_t^2$=5%.

Simulations and measurements were performed on a 2.5 GHz MIRC prototype implementing the differential wye topology of FIG. 24 with six Film Bulk Acoustic Resonators (FBARs), six switched capacitors, a modulation frequency $f_m$=6 MHz, and $Z_0$=50 ohm. The switched capacitors are implemented by three SPDT GaAs solid state monolithic switches and six series capacitors with capacitance $C_s$=300 if. FIG. 24 illustrates the topology with phase shifting indicated at each switch element. A properly sized capacitor in parallel to each switch is provided and operated such that the circuit is never open and sufficient modulation amplitude can be achieved. The differential topology results in suppression of IM products. Both one-port resonators and two-port resonators can be used.

Figure 26:
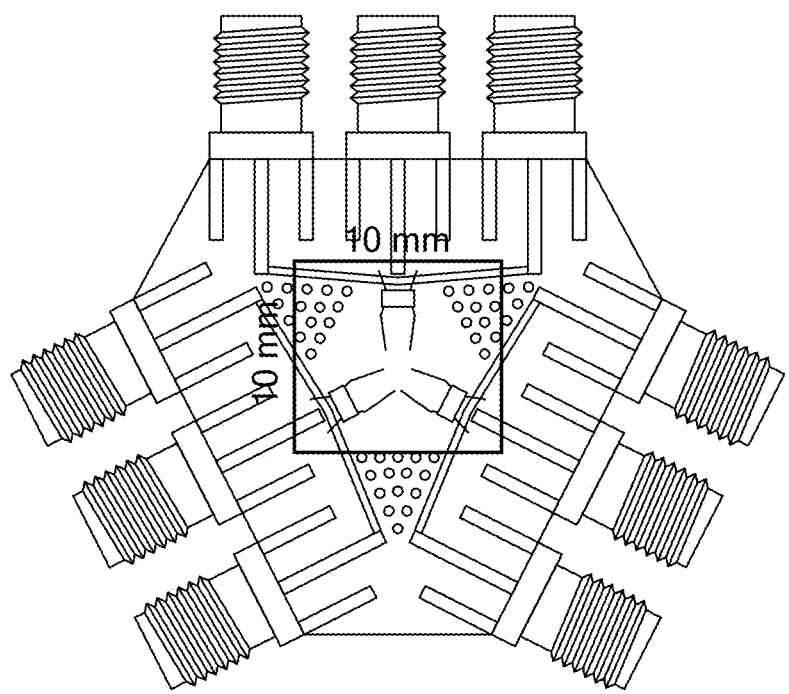
FIG. 26 is an illustration of a 2.5 GHz MIRC prototype employing the differential topology of FIG. 24 with six Film Bulk Acoustic Resonators (FBARs) and six switched capacitors (implemented by three SPDT GaAs solid state monolithic switches and six 300 fF capacitors) and a modulation frequency of 6 MHz.
Figure 27:
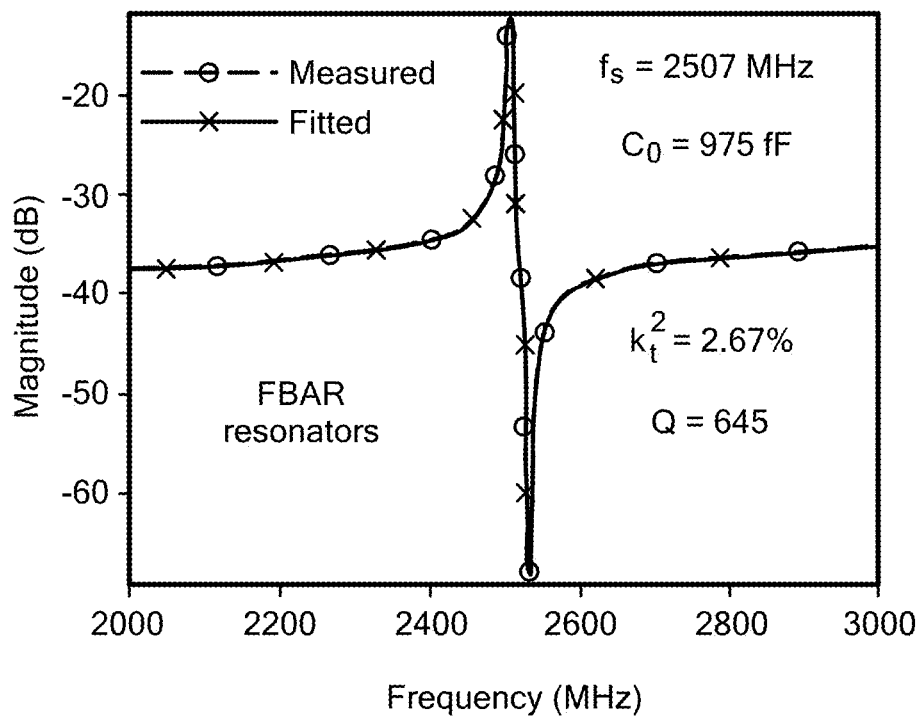
FIG. 27 is a graph of a MBVD fitting of measured admittance of one FBAR of the MIRC prototype of FIG. 26.
Figure 28:
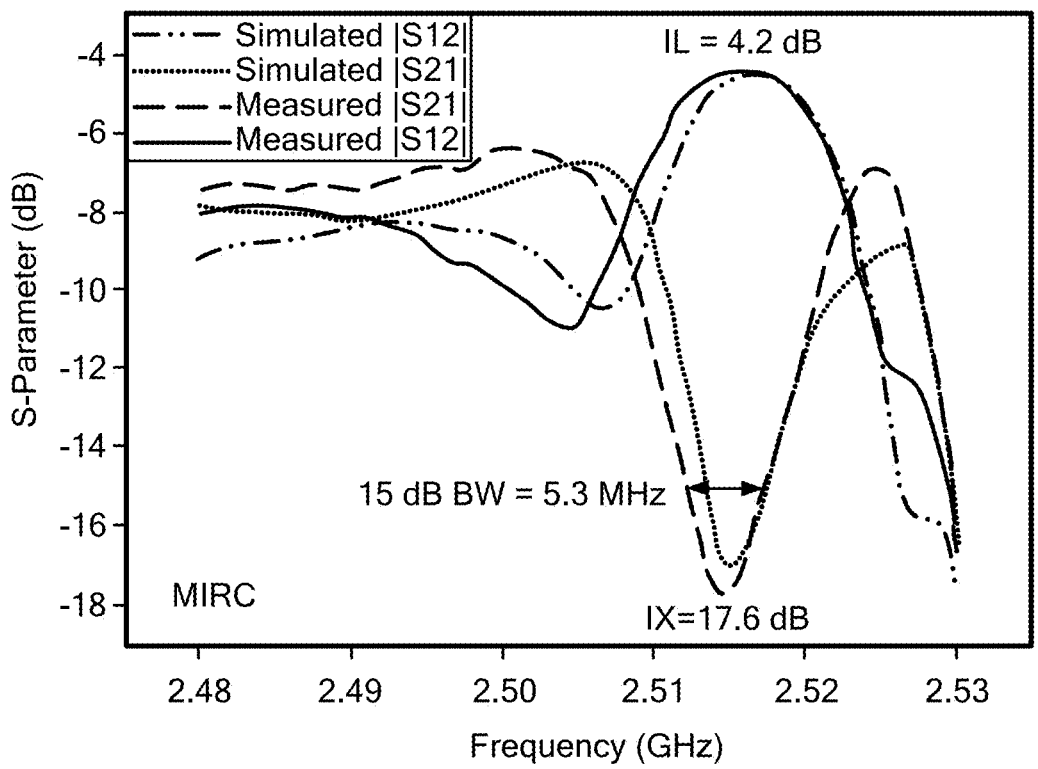
FIG. 28 is a graph comparing simulated and measured S parameters (insertion loss and isolation) vs. frequency for the MIRC prototype of FIG. 26.

FIG. 27 shows a graph of a MBVD fitting of measured admittance of one of the film bulk acoustic resonators (FBARs) at 2.5 GHz ($C_0$~1 pF, Q~700, $k_t^2$~3%) employed in the MIRC prototype of FIG. 26. Referring to FIG. 28, low loss (4.2 dB) and high isolation (17.6 dB) were achieved with a low modulation frequency of 6 MHz (0.28% of RF frequency), and low power consumption (6.8 µW) was also achieved. An ADS Momentum simulation, shown in FIG.

28, was performed to take into account parasitics from the PCB, showing excellent matching between simulation and measurement.

Figure 29:
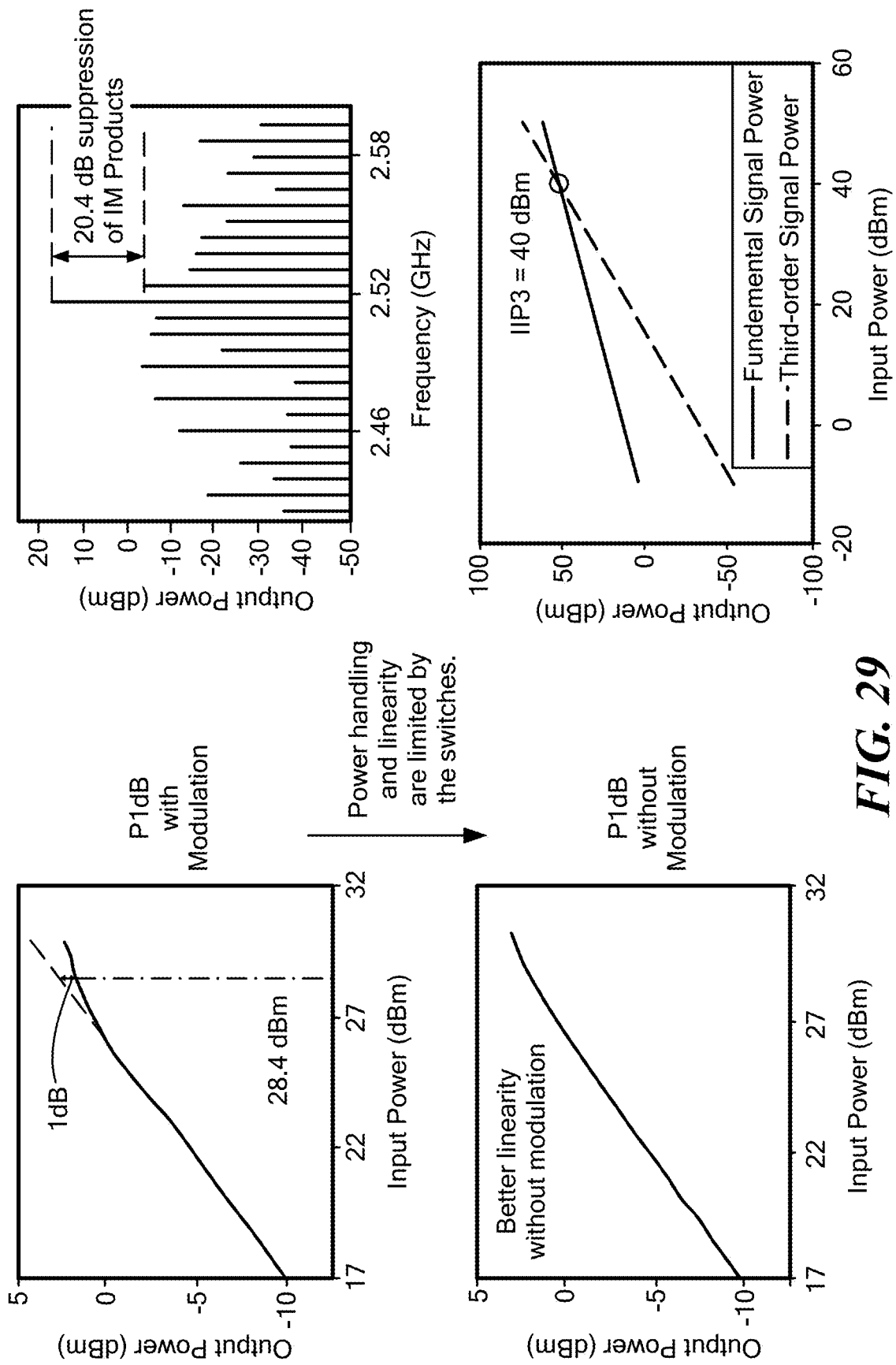
FIG. 29 is a set of graphs of output power of the MIRC prototype of FIG. 26 indicating high linearity and power handling and IM products suppression.

FIG. 29 illustrates that high linearity and power handling (P1 dB=28.4 dBm; IIP3=40 dBm) were achieved by using switches instead of varactors. IM products suppression was more than 20 dB due to the differential topology.

Figure 30:
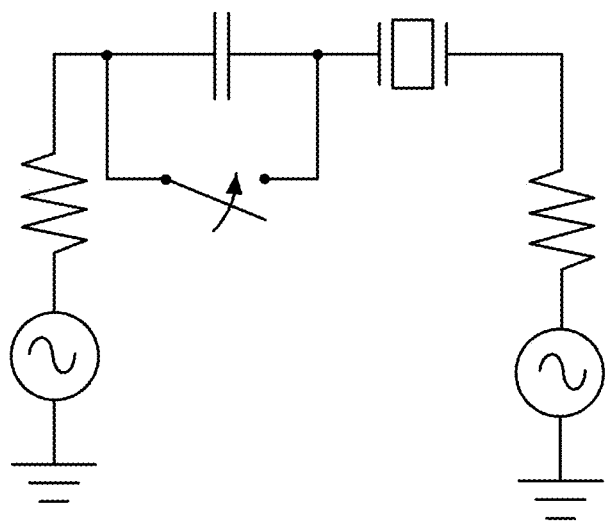
FIG. 30 is a schematic circuit diagram of a simulation circuit with a switched capacitor and MEMS resonator used in simulations.
Figure 31:
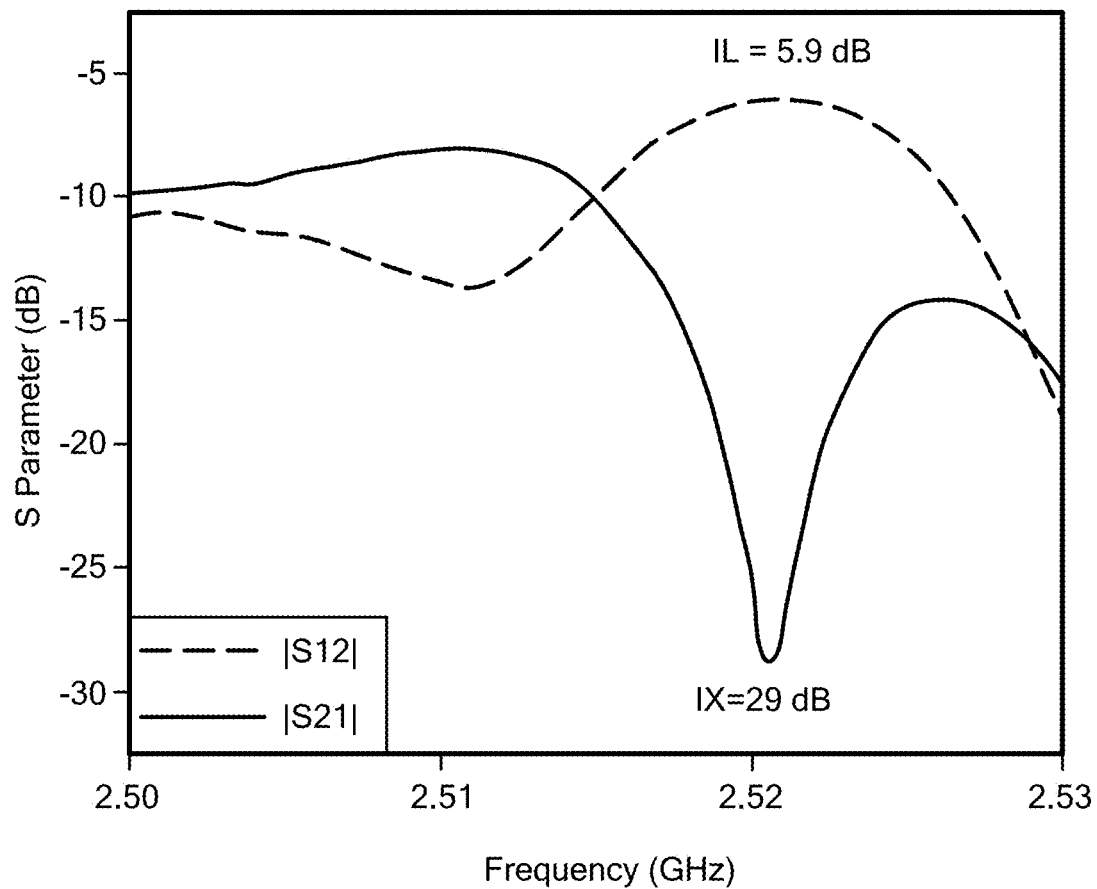
FIG. 31 is a graph of the simulated S parameters (isolation and insertion loss) vs. frequency for the MIRC schematic of FIG. 24 employing a smaller value of switched capacitance compared to the one sued in the prototype of FIG. 26.
Figure 32:
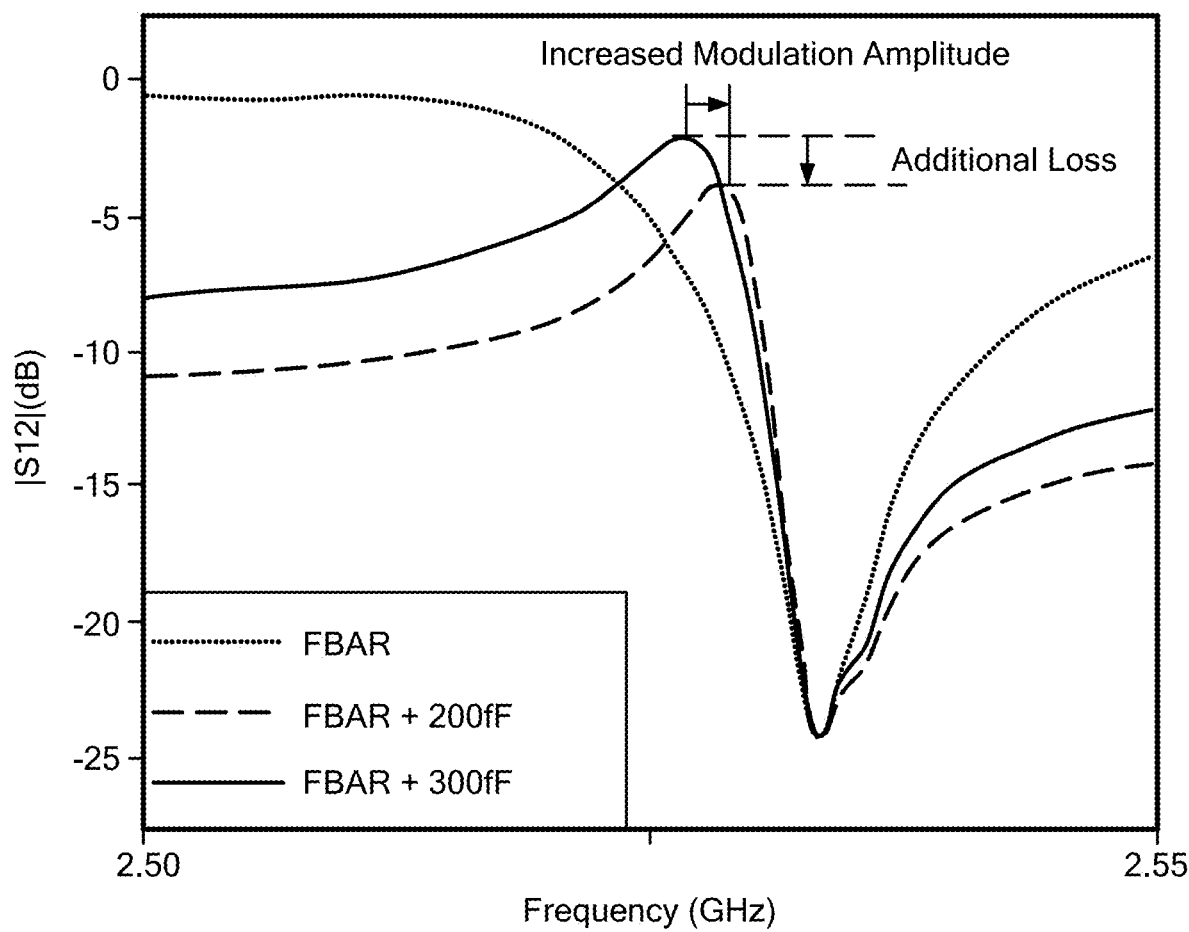
FIG. 32 is a graph of S parameters vs. frequency employing the simulation circuit of FIG. 30 at various capacitances.

Referring to FIGS. 30-32, the series capacitance $C_s$ was decreased from 300 fF to 200 fF. Isolation was improved from 17 dB to 29 dB, because of higher modulation amplitude. Insertion loss also increased from 4.2 dB to 5.9 dB, because of additional loss associated with larger modulation amplitude, but can be improved with a higher figure of merit MEMS resonator.

Figure 33:
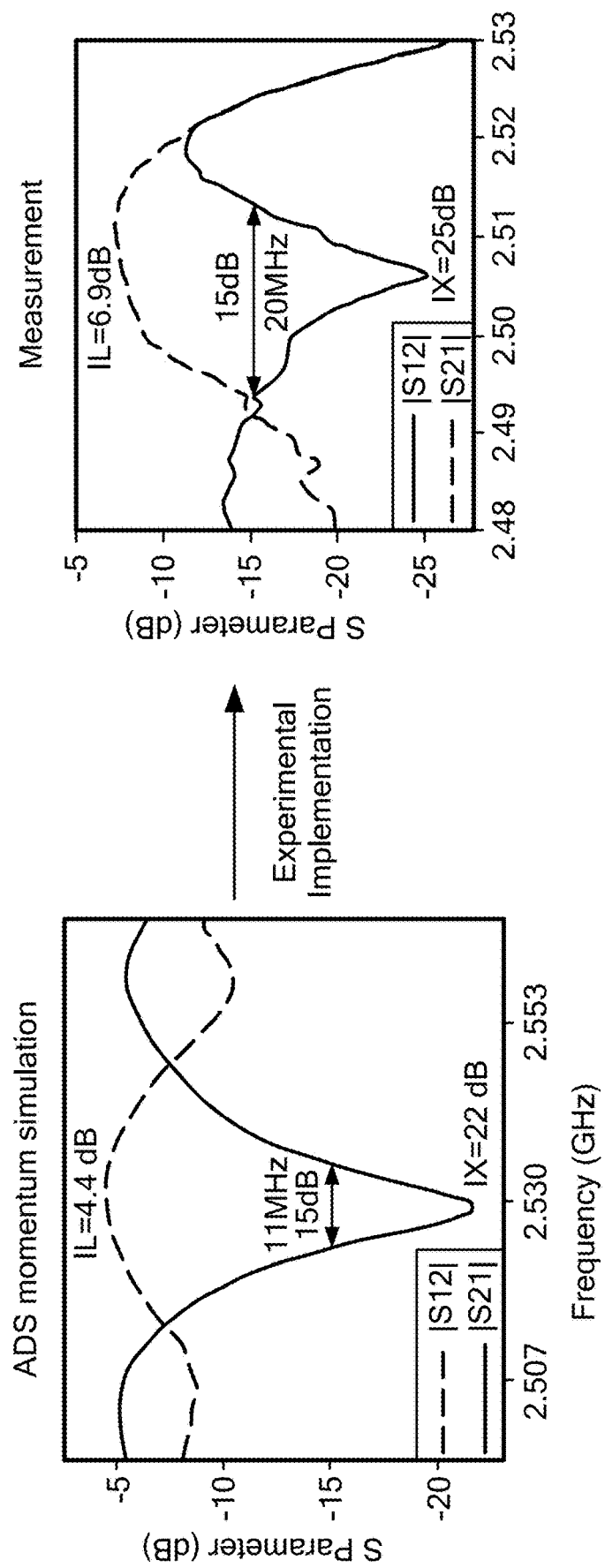
FIG. 33 is a set of graphs with simulated and measured S parameters (insertion loss and isolation) vs. frequency for the MIRC prototype of FIG. 26 using higher modulation frequency (10 MHz) than the one used in the experiment of FIG. 28 (6 MHz)

Referring to FIG. 33, bandwidth was broadened by increasing the modulation frequency. Insertion loss also increased; with a higher figure of merit MEMS resonators, the insertion loss can be improved. In FIG. 33 on the left, $f_m$ increased from 6 MHz to 10 MHz. An ideal switch model was used in the ADS Moment simulation. In the measurement shown on the right, the insertion loss was higher due to the relatively lossy RF switches that were used (IL @ 2.5 GHz=1 dB).

Figure 34:
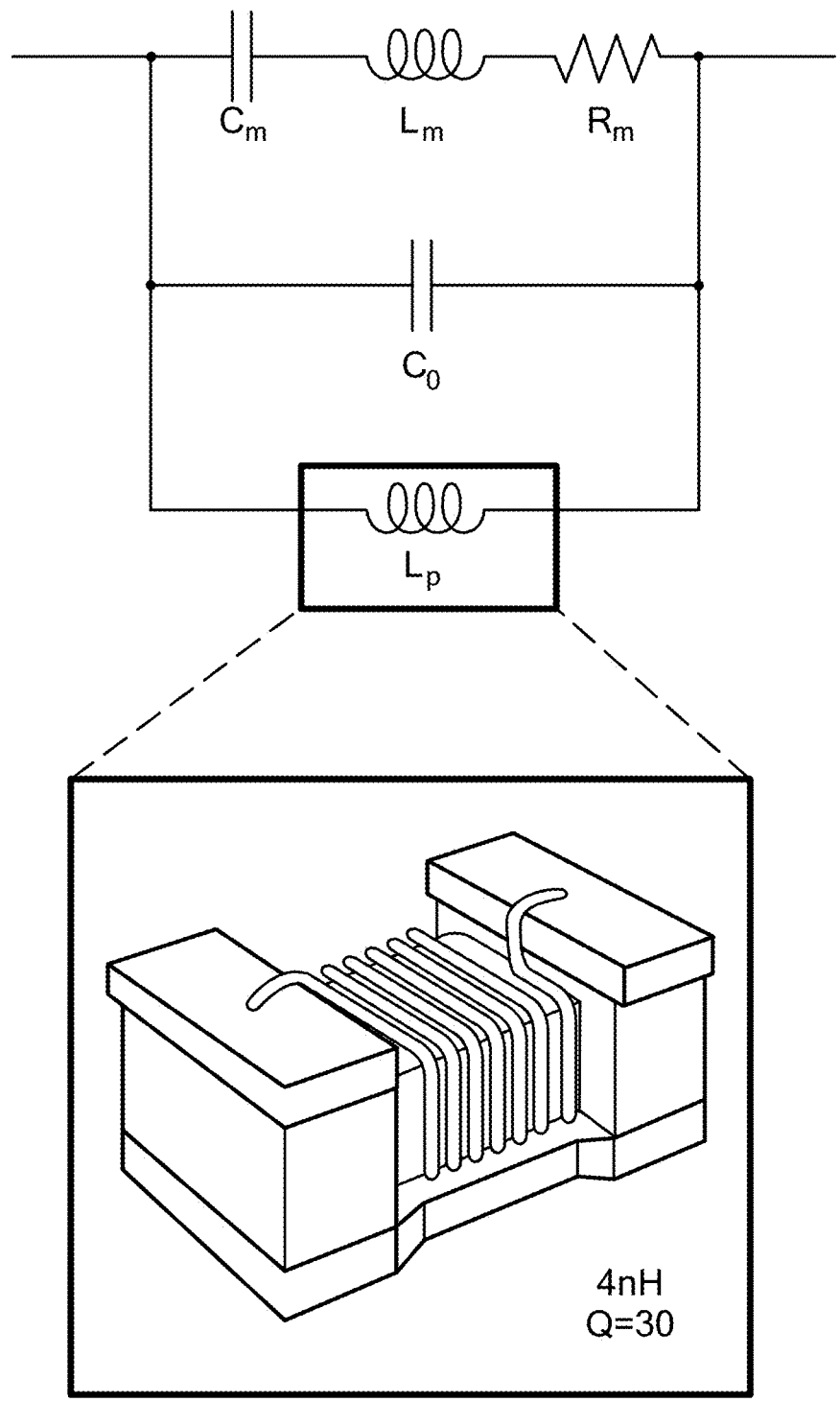
FIG. 34 is a schematic illustration of an equivalent circuit of an electromechanical resonator with an inductor connected in parallel to it.
Figure 35:
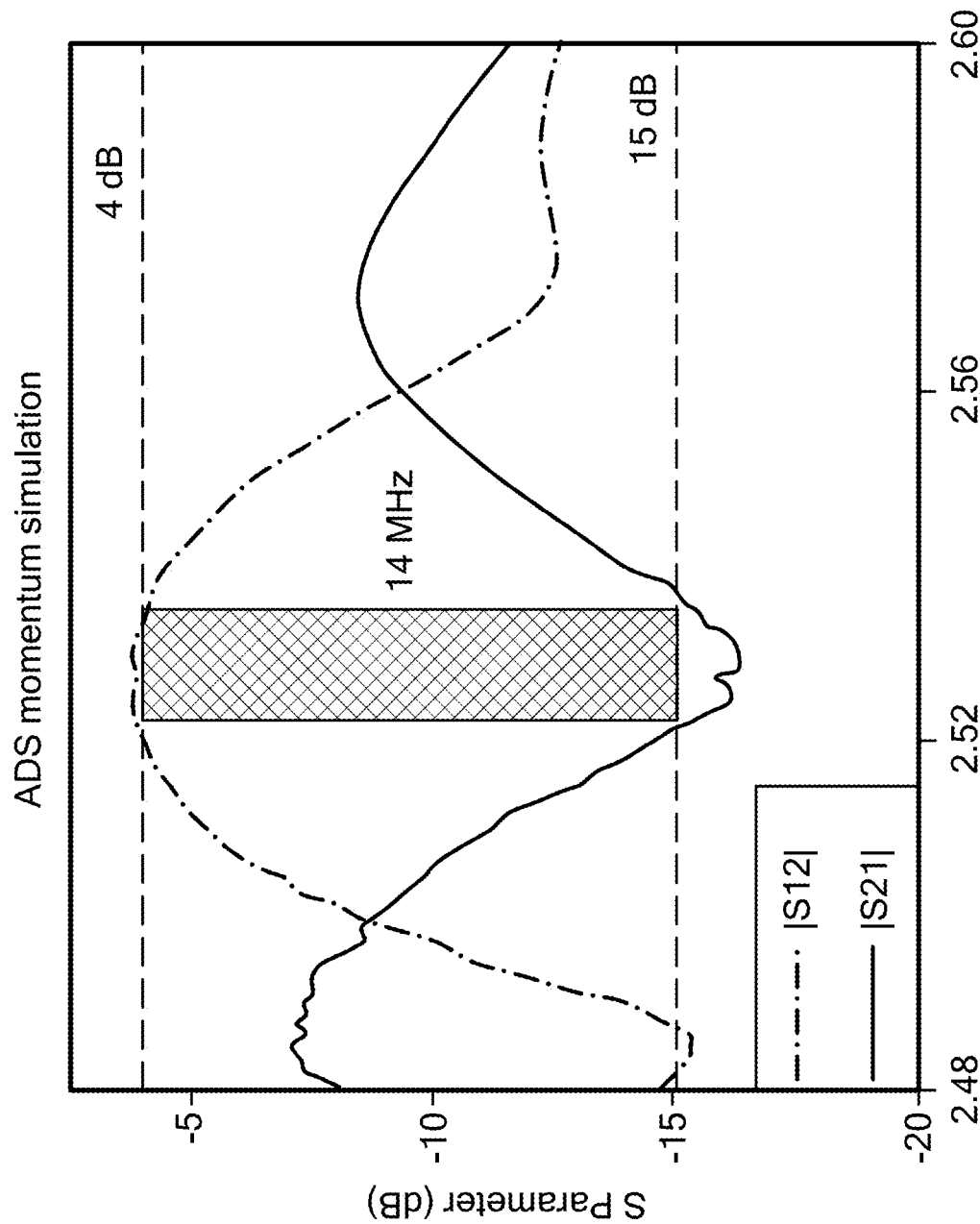
FIG. 35 is a graph of simulated S parameters vs. frequency of the MIRC of FIG. 24 employing the circuit of FIG. 34 as the electromechanical resonator element.

Referring to FIGS. 34 and 35, wider bandwidth was achieved by placing inductors in parallel to MEMS resonators, using the FBAR. A Murata LQW15AN4N0D8ZD inductor (4 nH, Q=30) was used. The inductor offset $C_0$ and broadened the bandwidth. The results of an ADS Momentum simulation are shown in FIG. 35.

Example 6

Figure 36:
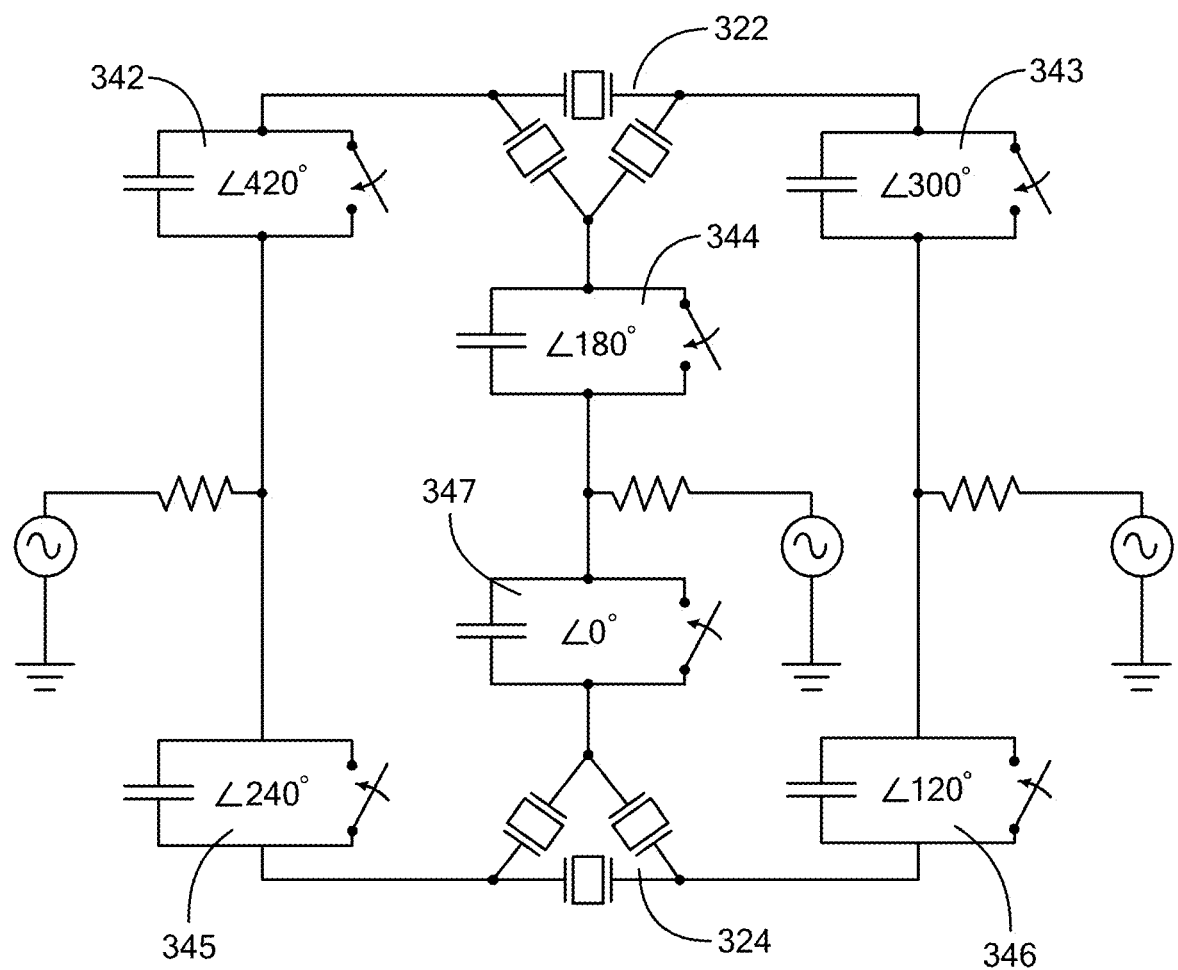
FIG. 36 is a schematic circuit diagram of an embodiment of MIRC device employing a differential delta-wye hybrid topology and indicating phase shifted values.
Figure 37:
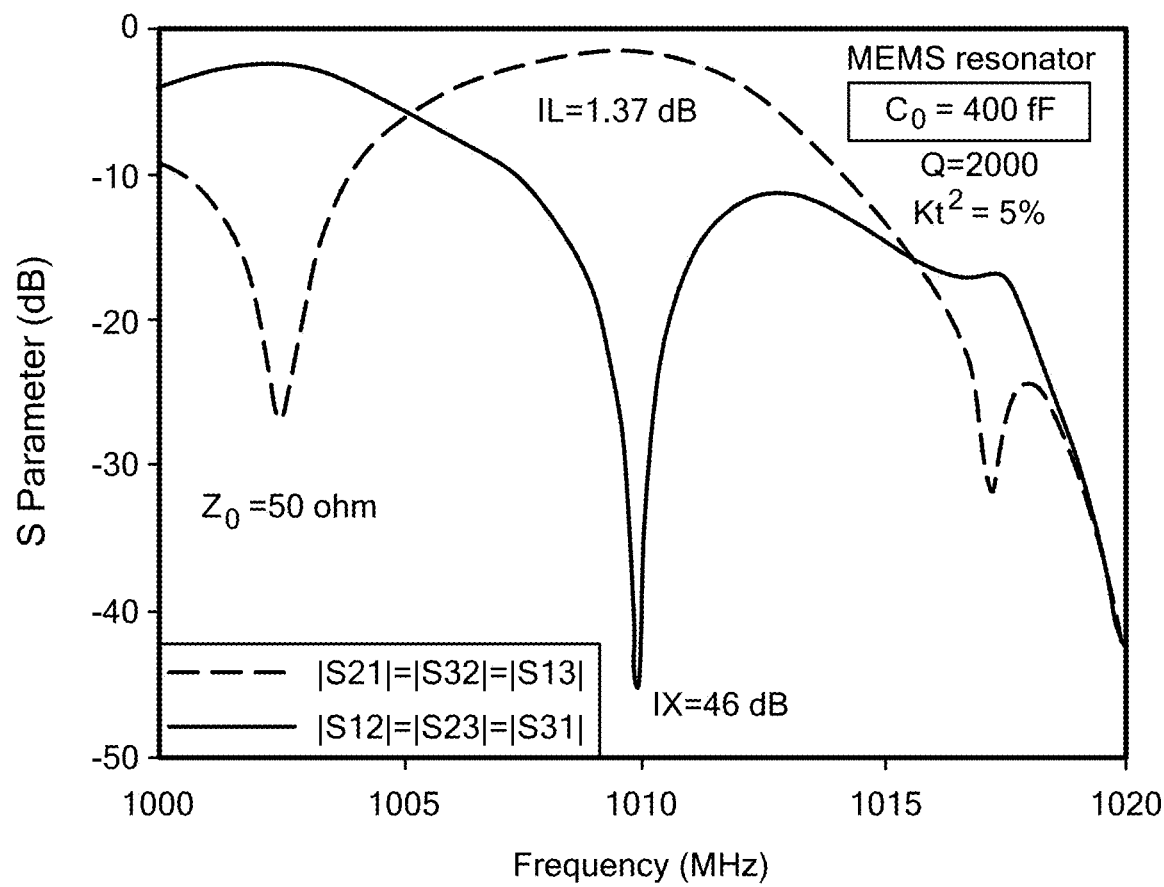
FIG. 37 is a graph of S parameters (insertion loss and isolation) vs. frequency based on simulation results of the topology of FIG. 36 with resonator parameters indicated in the inset.

Simulations on the differential delta-wye hybrid topology illustrated in FIG. 36 achieved similar results as with the wye topology in Example 5, but a lower $C_0$ for the MEMS resonator was used to achieve a 50 ohm matching condition. See FIG. 37. This topology can be more feasible in fabrication.

As used herein, "consisting essentially of" allows the inclusion of materials or steps that do not materially affect the basic and novel characteristics of the claim. Any recitation herein of the term "comprising," particularly in a description of components of a composition or in a description of elements of a device, can be exchanged with "consisting essentially of" or "consisting of."

It will be appreciated that the various features of the embodiments described herein can be combined in a variety of ways. For example, a feature described in conjunction with one embodiment may be included in another embodiment even if not explicitly described in conjunction with that embodiment.

To the extent that the appended claims have been drafted without multiple dependencies, this has been done only to accommodate formal requirements in jurisdictions which do not allow such multiple dependencies. It should be noted that all possible combinations of features which would be implied by rendering the claims multiply dependent are explicitly envisaged and should be considered part of the invention.

The present invention has been described in conjunction with certain preferred embodiments. It is to be understood that the invention is not limited to the exact details of construction, operation, exact materials or embodiments shown and described, and that various modifications, substitutions of equivalents, alterations to the compositions, and other changes to the embodiments disclosed herein will be apparent to one of skill in the art.

What is claimed is:

1. A microelectromechanical resonant circulator device comprising:
   a substrate, at least three electrical ports supported on the substrate;
   at least three electromechanical resonator elements; and
   at least three switch elements, each switch element electrically connected between at least one associated electromechanical resonator element of the at least three electromechanical resonator elements and at least one associated port of the at least three electrical ports, the at last three switch elements operative to provide commutation over time of the at least three electromechanical resonator elements.

2. The device of claim 1, wherein the at least three switch elements are operative to commutate the electromechanical resonator elements over time to form an equivalent resonator network with a resonance frequency or impedance or coupling modulated in time.

3. The device of claim 1, wherein the at least three switch elements are operative to commutate between at least one of a capacitor and a short circuit, a capacitor and an open circuit, an inductor and a short circuit, an inductor and an open circuit, and a short circuit and an open circuit.

4. The device of claim 1, wherein at least one switch element of the at least three switch elements comprises a capacitor in parallel with a switch, an inductor in parallel with a switch, a single pole single throw switch, or a single pole double throw switch.

5. The device of claim 1, wherein the at least three switch elements are operative at a same commutation frequency and shifted in phase or at different commutation frequencies and shifted in phase.

6. The device of claim 1, wherein the at least three switch elements are operative to provide commutation frequencies ranging from 0.001% to 300% of an operating frequency of the circulator device.

7. The device of claim 1, wherein the at least three electromechanical resonator elements are operative at a same frequency or at different frequencies.

8. The device of claim 1, further comprising an inductor disposed in parallel with each of the at least three electromechanical resonator element.

9. The device of claim 1, wherein the at least three electromechanical resonator elements are connected to a common node.

10. The device of claim 1, wherein the at least three electromechanical resonator elements are connected in a wye configuration, a delta configuration, a hybrid delta-wye configuration, or a differential configuration.

11. The device of claim 1, further comprising at least three additional electromechanical resonator elements connected to form a differential configuration with two branches shifted in phase by 180°.

12. The device of claim 1, wherein each of the at least three electromechanical resonator elements comprises a pair of resonators operative at a same frequency or at different frequencies.

13. The device of claim 12, wherein the at least three switch elements are operative to commutate between the resonators of each pair of resonators, each pair of resonators commutated at a same modulation frequency and shifted in phase.

14. The device of claim 1, wherein one or more electromechanical resonators of the at least three electromechanical resonators are disposed to form a filter element at each port of the at least three ports, and the at least three switch elements are operative to commutate the filter elements over time to form equivalent filter networks with frequencies or impedances or coupling modulated in time.

15. The device of claim 1, wherein at least one of the at least three electromechanical resonator elements comprises a Cross-sectional Lame Mode Resonator, a Contour-Mode Resonator, a Film Bulk Acoustic Resonator, a Surface Acoustic Wave Resonator, a MEMS (microelectromechanical system) Resonator, a NEMS (nanoelectromechanical system) Resonator, a Bulk Acoustic Wave (BAW) Resonator, a Quartz Crystal Resonator, an electromechanical delay line, or a dielectric resonator.

16. The device of claim 1, wherein at least one of the at least three electromechanical resonator elements comprises:
a piezoelectric layer having a length direction (L), a width direction (W), and a thickness direction (T);
a first conductive layer including at least one first electrode disposed over a top surface of the piezoelectric layer, wherein the top surface extends along the length direction and the width direction; and
a second conductive layer including at least one second electrode disposed over a bottom surface of the piezoelectric layer, wherein the bottom surface extends along the length direction and the width direction;
wherein either a vertical-extensional or lateral-extensional or two-dimensional mode of mechanical vibration is excited in a cross sectional plane of the piezoelectric layer in response to at least one signal provided to the at least one first electrode and/or the at least one second electrode.

17. The device of claim 16, wherein the vertical-extensional or lateral-extensional or two-dimensional mode of mechanical vibration in a cross sectional plane of the piezoelectric layer is sensed through a piezoelectrically generated charge collected by the at least one first electrode and/or the at least one second electrode.

18. The device of claim 16, wherein the cross sectional plane extends along the width direction and the thickness direction.

19. The device of claim 16, wherein a frequency of the vertical-extensional or lateral-extensional or two-dimensional mode of mechanical vibration is dependent on either the width direction or the thickness direction of the resonator structure or both the width direction and the thickness direction of the resonator structure.

20. The device of claim 16, wherein the piezoelectric layer includes at least one piezoelectric material selected from the group consisting of aluminum nitride, doped aluminum nitride, lithium niobate, lithium tantalate, zinc oxide, gallium nitride, and quartz.

21. The device of claim 1, wherein at least one of the at least three electromechanical resonator elements has a coupling coefficient $k_t^2$ of at least about 0.01%.

22. The device of claim 1, wherein at least one of the at least three electromechanical resonator elements has a quality factor Q of at least 10.

23. The device of claim 1, wherein at least one of the at least three electromechanical resonator elements is suspended from the substrate.

24. The device of claim 1, wherein at least one of the at least three electromechanical resonator elements is supported on the substrate with anchors located at displacement nodes.

25. The device of claim 24, wherein displacement at the anchors of at least one electromechanical resonator is near zero.

26. The device of claim 1, wherein at least one port of the at least three electrical ports is connectable to an antenna.

27. A method of operating the microelectromechanical resonant circulator device of claim 1, comprising operating the at least three switch elements to commutate the at least three electromechanical resonator elements over time at a determined modulation frequency.

28. A radio transceiver including the microelectromechanical resonant circulator device of claim 1.

29. A non-reciprocal circuit including the microelectromechanical resonant circulator device of claim 1.

* * * * *